US006412090B1

(12) United States Patent
Pan et al.

(10) Patent No.: US 6,412,090 B1
(45) Date of Patent: Jun. 25, 2002

(54) GALOIS FIELD COMPUTATION SYSTEM AND METHOD

(75) Inventors: Wenwei Pan; Yue-Peng Zheng, both of Ocean Township, NJ (US)

(73) Assignee: GlobespanVirata, Inc., Red Bank, NJ (US)

( * ) Notice: Subject to any disclaimer, the term of this patent is extended or adjusted under 35 U.S.C. 154(b) by 0 days.

(21) Appl. No.: 09/336,626

(22) Filed: Jun. 18, 1999

Related U.S. Application Data

(60) Provisional application No. 60/090,027, filed on Jun. 18, 1998.

(51) Int. Cl.[7] .............................................. H03M 13/15
(52) U.S. Cl. ...................................................... 714/784
(58) Field of Search ........................................ 714/784

(56) References Cited

U.S. PATENT DOCUMENTS

| | | | | |
|---|---|---|---|---|
| 4,162,480 A | | 7/1979 | Berlekamp | 240/146.1 |
| 4,833,678 A | | 5/1989 | Cohen | 371/37 |
| 5,414,719 A | * | 5/1995 | Iwaki et al. | 371/37.1 |
| 5,446,743 A | | 8/1995 | Zook | 371/371 |
| 5,712,861 A | * | 1/1998 | Inoue et al. | 371/37.1 |
| 5,818,854 A | | 10/1998 | Meyer | 371/37.1 |
| 5,944,848 A | * | 8/1999 | Huang | 714/784 |
| 5,983,389 A | * | 11/1999 | Shimizu | 714/781 |
| 6,052,815 A | * | 4/2000 | Zook | 714/758 |
| 6,209,114 B1 | * | 3/2001 | Wolf et al. | 714/784 |

OTHER PUBLICATIONS

Richard E. Blahut, "Theory and Practice of Error Control Codes," Addison–Wesley Publishing Co., Inc., 1983 pp. 174–191.

Lin, et al., "Error Control Coding Fundamentals and Applications," Prentice–Hall, Inc. 1983, pp. 170–176.

Whitaker, et al.,. "Reed Solomon VLSI Codec for Advanced Television," IEEE Transactions on Circuits and Systems for Video Technology, vol. 1, No. 2, Jun. 1991, pp. 230–236.

Kuang Yung Liu, "Architecture for VLSi Design of Reed–Solomon Decoders, " IEEE Transactions on Computers, vol. C–33, No. 2, Feb. 1984, pp. 178–189.

Shayan, et al., "A Versatile Time–Domain Reed–Solomon Decoder," IEEE Journal on Selected Areas in Communications, vol. 8, No. 8, Oct. 1990, pp. 1535–1542.

Todoroki et al., "Design of a Reed–Solomon Decoder Using a Digital Signal Processor (DSP)", ITS '90, pp. 443–445.*

Drescher et al., "VLSI Architecture for Datapath Integration of Arithmetic over GF(2m) on Digital Signal Processors", ICASSP–97, pp. 631–634.*

Song et al., "Low–Energy Heterogeous Digit–Serial Reed–Solomon Codecs", ICASSP–98, pp. 3049–3052.*

* cited by examiner

Primary Examiner—Stephen M. Baker
(74) Attorney, Agent, or Firm—Thomas, Kayden, Horstemeyer & Risley

(57) ABSTRACT

Disclosed is a configurable Galois field computation system and method, the system comprising a read bus and a write bus with a memory coupled therebetween. In addition, a logical circuit is coupled between the read and write busses, the logical circuit having a number of data calculation configurations that are established to generate an n symbol codeword from a number of symbols in a syndrome array. The logical circuit is placed in the various data calculation configurations in order to perform the various operations involved with Reed-Solomon decoding.

27 Claims, 19 Drawing Sheets

GALOIS FIELD COMPUTATION SYSTEM AND METHOD

This application claims priority to copending U.S. provisional patent application entitled "Programmable Reed-Solomon Decoding Processor" filed on Jun. 18, 1998 and accorded Ser. No. 60/090,027, which is entirely incorporated herein by reference. This application is also related to co-pending U.S. patent application entitled "Configurable Decoder and Method for Decoding a Reed-Solomon Codeword", accorded Ser. No. 09/335,975 and to co-pending U.S. patent application entitled "Configurable Reed-Solomon Controller and Method", accorded Ser. No. 08/690,243, both of which were filed on even data herewith.

TECHNICAL FIELD

The present invention is generally related to data communications and, more particularly, is related to Reed-Solomon ("RS") decoding employed to minimize or eliminate errors in data communication.

BACKGROUND OF THE INVENTION

Communication of information in the form of digital data is quite commonplace in today's society. There are many different communications channels that may be employed to facilitate such data communication. Such channels may include existing telecommunications networks, optical fiber networks, cellular networks, the Internet, wide area networks, local area networks, or other like media. It is often the case that the communications channels chosen do not provide a perfect medium to transfer data information, and for various reasons such as noise, interference, or other phenomena, errors may be introduced into the data stream transmitted across a particular channel.

Many different approaches have been proposed to either reduce or eliminate errors in data communications. One such approach is to employ Reed-Solomon encoding/decoding. When employing Reed-Solomon encoding/decoding, data is transmitted in codewords which include a number of parity symbols along with the original data symbols. The parity symbols are generated using a Reed-Solomon encoder.

When using Reed-Solomon encoding, various numbers of parity symbols may be generated to allow a data system to correct up to a specific number of possible errors in the transmitted data. However, for each different number of total parity symbols generated, there is a unique Reed-Solomon generator polynomial with a specific number of coefficients employed. Thus, the typical Reed-Solomon encoder creates a specific number of parity symbols, which limits its usefulness if greater or fewer parity symbols are desired. Likewise, Reed-Solomon decoders are employed to correct errors in the transmission using the same specific number of parity symbols which limits its usefulness in the same manner.

SUMMARY OF THE INVENTION

The present invention provides a configurable Galois field computation system and method that addresses the above concerns. Broadly stated, the configurable Galois field computation system comprises a read bus and a write bus with a memory coupled therebetween. In addition, a logical circuit is coupled between the read and write busses, the logical circuit having a number of data calculation configurations that are established to generate an n symbol codeword from a number of symbols in a syndrome array. The logical circuit is placed in the various data calculation configurations in order to perform the various operations involved with Reed-Solomon decoding.

The present invention can also be viewed as providing a method performing a number of calculations in a Galois field computation unit to generate a symbol codeword from a number of symbols in a syndrome array. The present method comprises the steps of: storing a number of data symbols in a memory; establishing at least one data calculation configuration in a logical circuit having a number of data paths, the logical circuit being coupled to the memory; applying the data symbols to the data paths to perform a data calculation based upon the data calculation configuration established; and storing a result of the data calculation in the memory.

A significant advantage of the present invention is that it is highly configurable to implement Reed-Solomon decoding for different data communications applications, etc. Specifically, the Galois field computation unit of the present invention may be configured to decode Reed-Solomon codewords having various numbers of parity symbols and data symbols. The present invention is also economical in that it requires a minimum number of logical components to implement and is power efficient, while at the same time being highly configurable. Specifically, the Galois field computation unit can be configured to perform calculations inherent in a Berlekamp-Massey algorithm, a Chien search algorithm, and a Forney algorithm, etc., in an efficient manner during different decoding phases.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
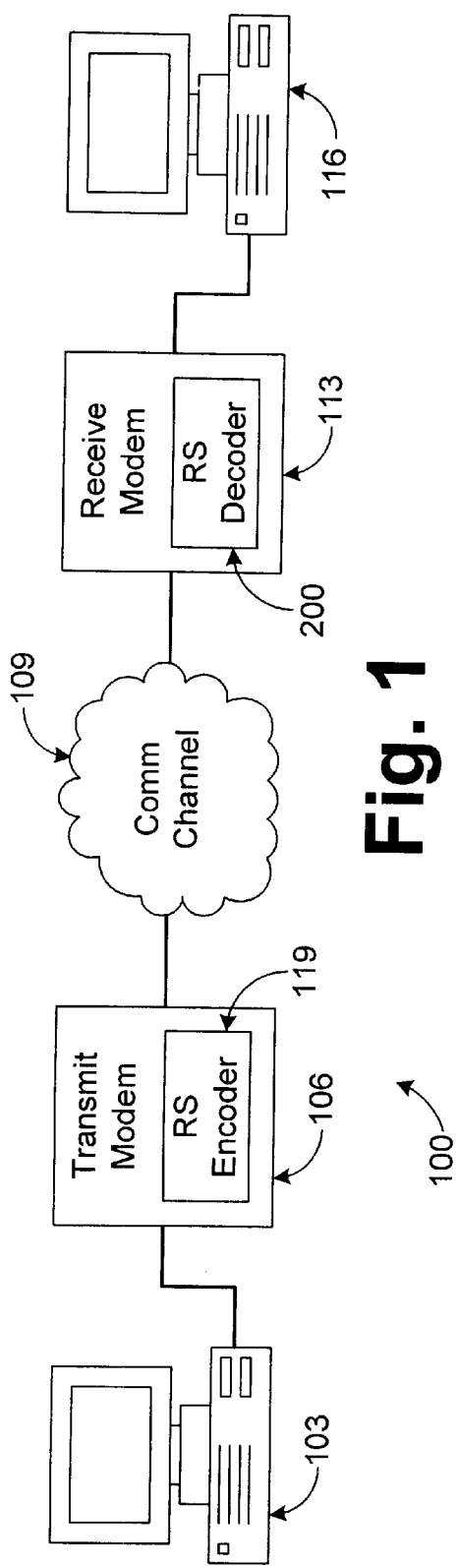
FIG. 1 is a block diagram of a data communications system according to an embodiment of the present invention.

With reference to FIG. 1, shown is a data communications system 100 according to an embodiment of the present invention. The data communications system 100 includes a first data terminal device 103 which is coupled to a transmit modem 106. The transmit modem 106 is, in turn, coupled to a communications channel 109. The communications channel 109 is coupled to receive modem 113 that is coupled, in turn, to a second data terminal device 116. The transmit modem 106 includes a Reed-Solomon (RS) encoder 119 and the receive modem 113 includes an RS decoder 200.

The first and second data terminal devices 103 and 116 may be, for example, computer systems, workstations, or other devices that may transmit or receive data. The communications channel 109 may be, for example, a telecommunications network, the Internet, a cellular network, a local area network (LAN), a wide area network, or other similar networks or combinations of networks which employ various mediums such as copper wire, optical fibers, air, etc.

During operation of the data communications system 100, the first data terminal device 103 generates data to transmit to the second data terminal device 116. The first data terminal device 103 applies the data to the transmit modem 106 that modulates the data for transmission across the communications channel 109. The transmit modem 106 also encodes the data using the RS encoder 119 into n symbol codewords. The n symbol codewords are transmitted across the communications channel 109 and are applied to the receive modem 113 which recovers the transmitted data using the RS decoder 200. Thereafter, the data is applied to the second data terminal device 116. Although the operation of the data communications system 100 is described as being unidirectional, it is understood that the data communications system 100 may be bi-directional where the modems 106 and 113 both transmit and receive data across the communications channel 109 and employ both RS encoding and decoding.

Figure 2:
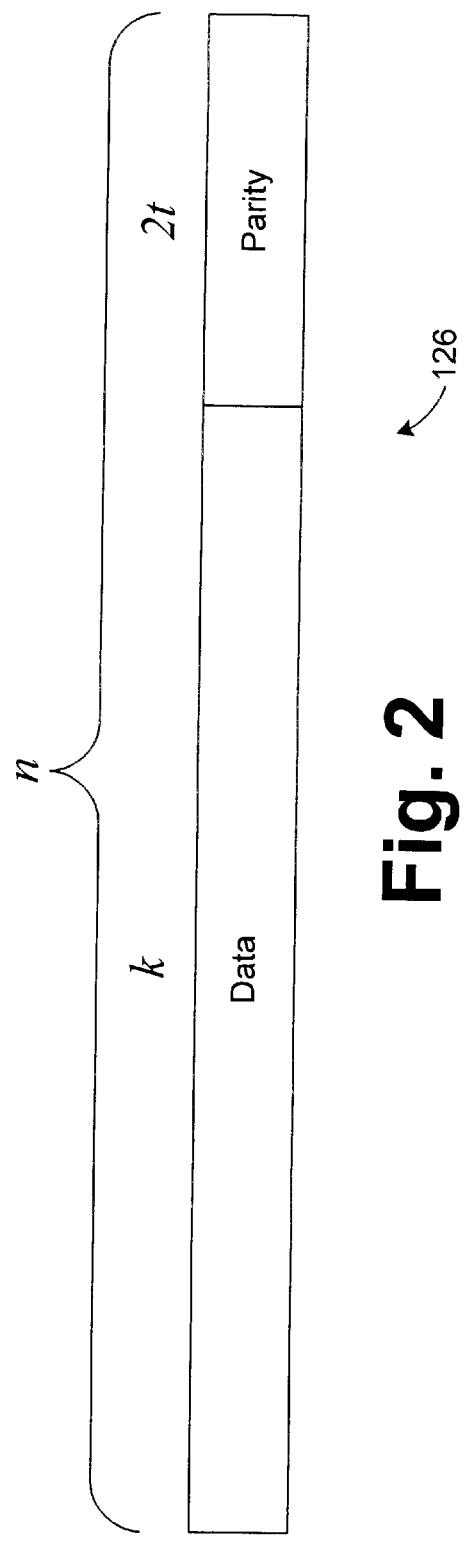
FIG. 2 is a drawing of an n symbol codeword transmitted by the data communications system of FIG. 1.

With reference to FIG. 2, shown is an n symbol codeword 126 that is created using Reed-Solomon encoding. The n symbol codeword 126 comprises k data symbols of s bits each with n–k parity symbols of s bits each added thereto. The total number of parity symbols is equal to 2t, where 2t=n–k. The n symbol codeword 126 may be referred to as a systematic code because the data is left unchanged and the parity symbols are appended. Reed-Solomon codes provide a significant advantage in that they can correct up to t symbol errors in the n symbol codeword 126. Given a symbol size s (the bit width per symbol), the maximum codeword length n for a Reed-Solomon code is $n=2^s-1$. Generally, the amount of processing power required to encode and decode Reed-Solomon codes is related to the number of parity symbols per n symbol codeword. A large value for t translates into the ability to correct a large number of errors in the received n symbol codeword, but correspondingly requiring more computational power than would be the case if t were smaller.

A Reed-Solomon n symbol codeword 126 is generated using a generator polynomial, where all valid codewords are exactly divisible by the generator polynomial. The form of the generator polynomial is given by $$g(x)=(x-\alpha^i)(x-\alpha^{i+1}) \ldots (x-\alpha^{i+2t-1}),$$

and the n symbol codeword 126 is generated using $$c(x)=g(x)i(x),$$

where $g(x)$ is the generator polynomial, $i(x)$ is the information or data block, and $c(x)$ is a valid n symbol codeword 126, and $\alpha$ is referred to as a primitive element of the field. The 2t parity symbols in the n symbol codeword 126 are given by $$p(x)=i(x)x^{n-k} \mod g(x).$$

As the present invention is directed to the RS decoder 200, further discussion of the generation of Reed-Solomon codes is omitted herein.

Figure 3:
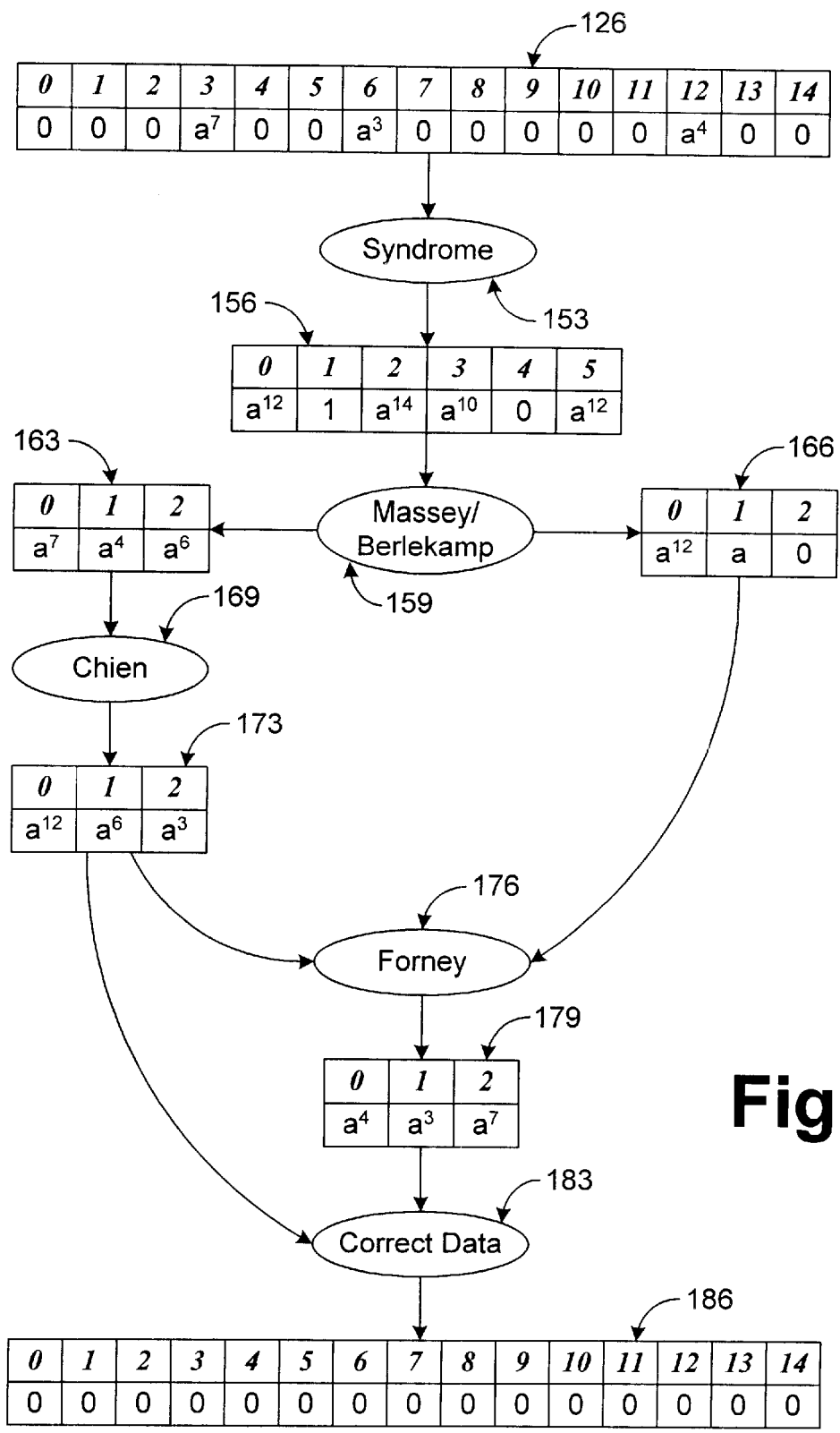
FIG. 3 is a flow chart of a Reed-Solomon decoding algorithms executed by a Reed-Solomon decoder employed in the data communications system of FIG. 1.

Turning then to FIG. 3, shown is a flow chart that provides an overview of the Reed-Solomon decoding process performed for an n symbol codeword 126 in the RS decoder 200 (FIG. 1). For purposes of illustration, the n symbol codeword 126 shown comprises 15 symbols, six of those symbols being parity symbols. This means that n=15, k=9, and t=3, although it is understood that the decoder of the present invention applies to valid codewords of all sizes with various number of parity symbols. The n symbol codeword 126 is applied to syndrome array calculator 153 that generates a syndrome array 156. The syndrome array 156 is then applied to a Berlekamp-Massey algorithm 159 that generates an error locator array 163 that is comprised of a number of coefficients for a lambda polynomial $\lambda(x)$, and an error evaluator array 166 that is comprised of a number of coefficients for an omega polynomial $\Omega(x)$. The error locator array 163 is applied to a Chien search algorithm 169 that generates an error location array 173. The error location array 173 and the error evaluator array 166 are both applied to a Forney algorithm 176 that generates an error value array 179. The error value array 179 and the error location array 173 are both applied to a correct data routine 183 that generates a corrected n symbol codeword 186.

Figure 4:
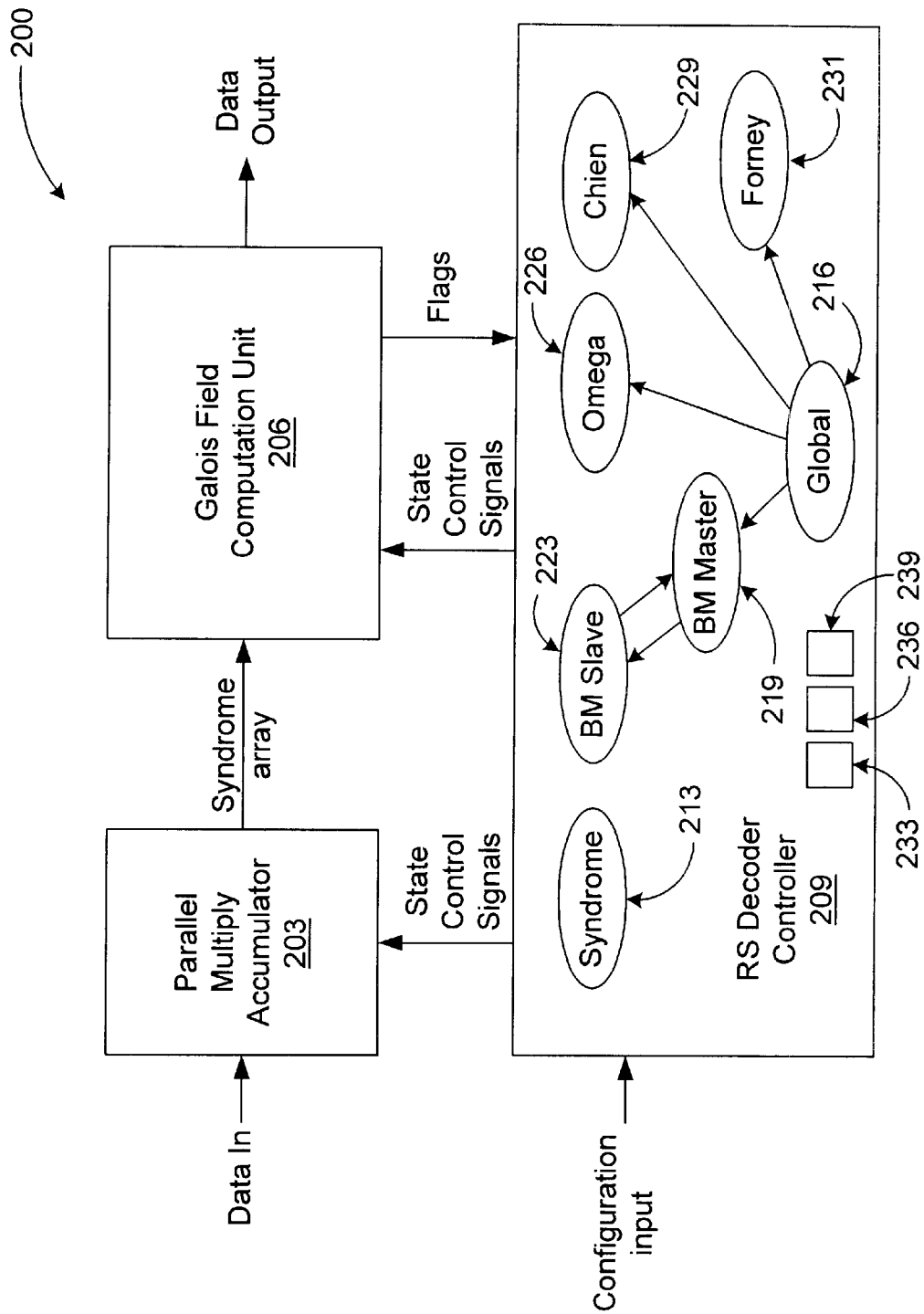
FIG. 4 is a functional block diagram of the Reed-Solomon decoder employed in the data communications system of FIG. 1.

With reference to FIG. 4, shown is a block diagram of an RS decoder 200 according to an embodiment of the present invention. The RS decoder 200 includes a parallel multiply accumulator 203, a Galois field computation unit 206, and an RS decoder controller 209. The parallel multiply accumulator 203 receives an RS encoded data input and generates the syndrome array 156 (FIG. 3) for each n symbol codeword, where the multiply accumulator 203 performs the functionality of the syndrome array calculator 153 (FIG. 3). The syndrome array 156 is applied to the Galois field computation unit 206 that executes the Berlekamp-Massey algorithm 159, Chien search algorithm 169, the Forney algorithm 176, and the correct data routine 183, thereby generating the corrected n symbol codeword 186.

The RS decoder controller 209 generally controls the operation of the parallel multiply accumulator 203 and the Galois field computation unit 206 by manipulating the various control inputs of the components therein using state machinery within the RS decoder controller 209. The state machinery of the RS decoder controller 209 can be, for example, a heirachical master-slave configuration. The state machinery includes a syndrome state machine 213, a global state machine 216, a Berlekamp-Massey master state machine 219, a Berlekamp-Massey slave state machine 223, an Omega state machine 226, a Chien state machine 229, and a Forney state machine 231. These state machines are discussed in detail with reference to appropriate state diagrams in text that follows.

The RS decoder controller 209 also includes a error correction capability configuration register 233, a modulation type register 236, and a codeword length register 239. The error correction capability configuration register 233 stores a predetermined error correction capability configuration comprising a value of t placed therein by the user that configures the RS decoder 200 to decode an n symbol codeword having 2t parity symbols. The modulation type register 236 indicates a modulation type configuration, the modulation type register 236 comprising a bit register that is set at a logical "1" when discrete multitone (DMT) line code is employed and at a logical "0" when carrierless amplitude-phase/quadrature amplitude (CAP/QAM) line codes are employed. Note that the modulation type register 236 may also comprise a multiple bit register to distinguish among more modulation types, etc. The value placed in the codeword length register 239 indicates a codeword length configuration that comprises the total number of symbols in the n-symbol codeword 126 to be decoded by the RS decoder 200. Generally the total number of symbols n in the n symbol codeword 126 may range from greater than or equal to 1, or less than or equal to 255, but may be any range, depending upon the size of the Galois field. Thus, the RS decoder 200 is highly configurable for codewords of different sizes, different numbers of parity symbols, and different modulation types.

Figure 5:
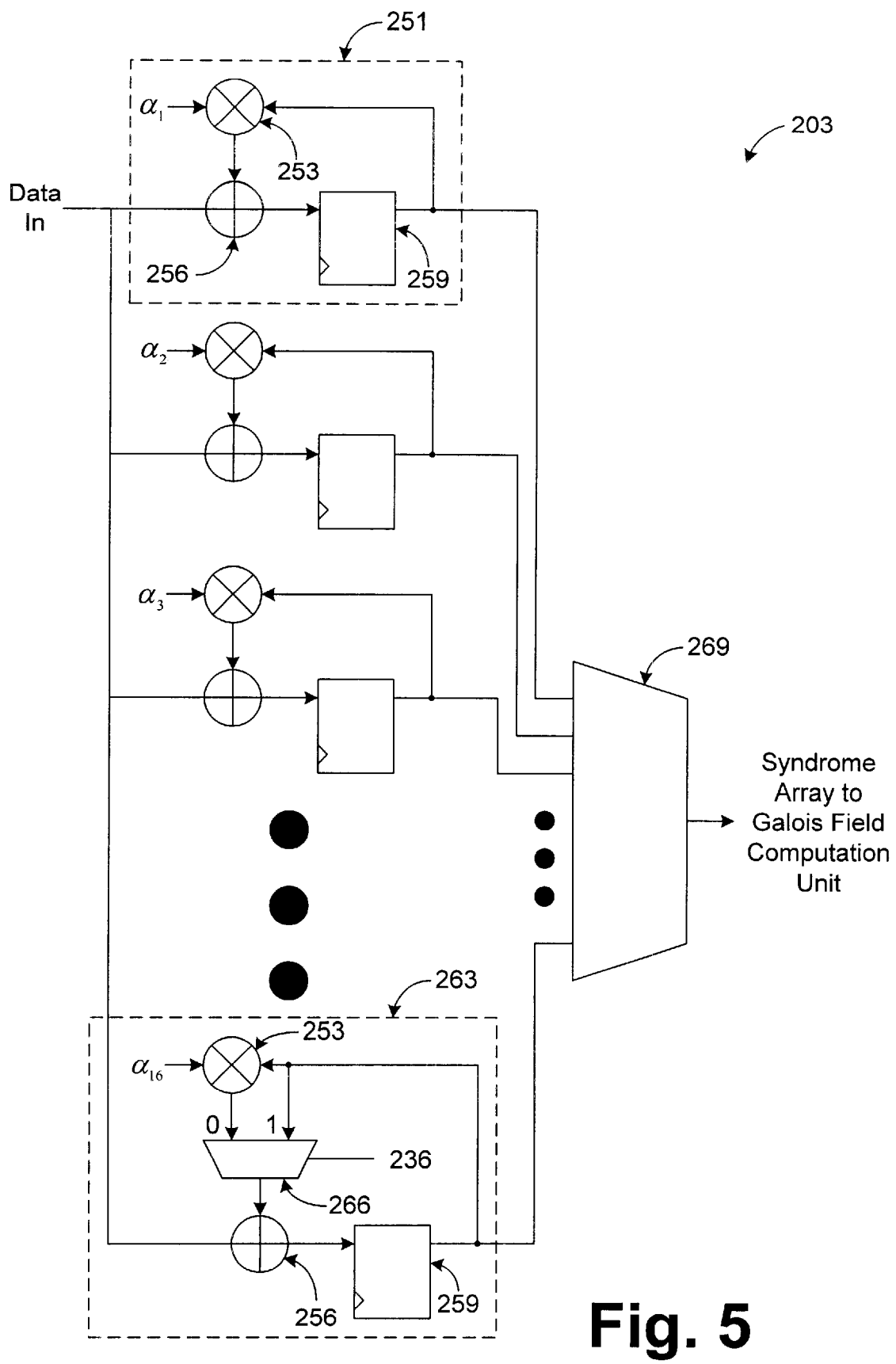
FIG. 5 is functional block diagram of a parallel accumulator employed in the Reed-Solomon decoder of FIG. 4.

Turning to FIG. 5, shown is the parallel multiply accumulator 203. The parallel multiply accumulator 203 serves to perform syndrome computation on incoming data comprising n symbol codeword 126 (FIG. 2). The parallel multiply accumulator 203 comprises a number of individual multiply accumulators 251, each having a multiplier 253, an adder 256, and a register 259. The multipliers 253 each receive the value from the registers 259 and a constant alpha value $\alpha_i$. The alpha values $\alpha_i$ are generally determined by the particular RS decoding scheme specified. Note that the multiply accumulator 203 also includes a CAP/DMT/QAM multiply accumulator 263 that is similar to the individual multiply accumulators 251 with the addition of a multiplexer 266. Although a total of sixteen multiply accumulators 251, 263 are shown, there may be any number of multiply accumulators 251, 263 employed. The multiplexer 266 allows the CAP/QAM/DMT multiply accumulator 263 to be configured for operation using CAP/QAM or DMT modulation schemes. When the RS decoder 200 (FIG. 4) is configured to operate using CAP/QAM by setting the modulation type register 236 (FIG. 4) to "0", the CAP/QAM/DMT multiply accumulator 263 employs the multiplier 253. On the other hand, if the RS decoder 200 is configured to operate using DMT by setting the modulation type register 236 "1", the multiplier 253 is not employed. The parallel multiply accumulator 203 also includes a selection multiplexer 269 that is employed to provide the contents of the registers 259 to the Galois field computation unit 206 as needed.

During operation, the symbols of an n symbol codeword are applied to the adders 256 and the multiply accumulations are performed accordingly. Thereafter, the values stored in the registers 259 are read out via the selection multiplexer 269 to the Galois field computation unit 206. Note that any number of the multiply accumulators 251, 263 may be employed for different numbers of parity symbols t as determined by the value placed in the error correction capability configuration register 233 (FIG. 4). In addition, only those multiply accumulators 251, 263 actually employed may be enabled so that power savings may be obtained.

Figure 6:
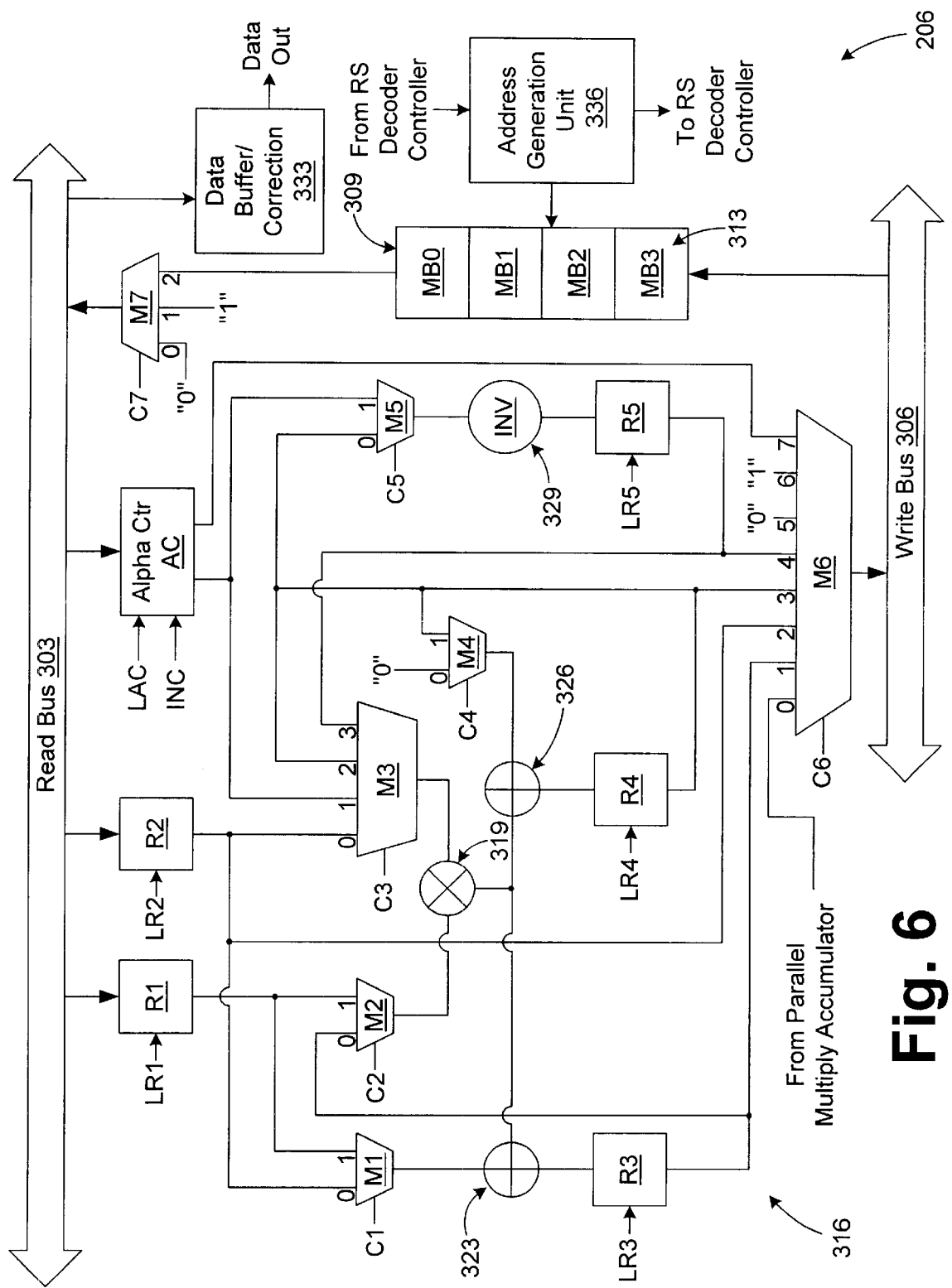
FIG. 6 is a schematic of a Galois field computation unit employed by the Reed-Solomon decoder of FIG. 4.

With reference to FIG. 6, shown is the Galois field computation unit 206 according to an embodiment of the present invention. The Galois field computation unit 206 includes a write bus 306 and a read bus 303. A memory 309 is coupled between the write bus 306 and the read bus 303. The memory 309 includes four separate memory banks 313 each holding sixteen bytes, the memory banks 313 being labeled MB0, MB1, MB2, and MB3 respectively. Also coupled between the read bus 303 and the write bus 306 is a logical circuit 316 comprising several logical components that form a number of data paths.

The various data paths are manipulated to perform a number of calculations during the RS decoding process based upon the various algorithms executed as previously discussed. In the ensuing discussion, first the interconnections of the components that create the various data paths are described. Then, the control of these components to establish the various data paths to perform the various calculations, etc., is described with reference to several state diagrams that detail the operation of the RS decoder 200 (FIG. 4).

So then, to continue to description of the Galois field computation unit 206, the read bus 303 is coupled to inputs of a first register R1, a second register R2, and an alpha counter AC. The first register R1, second register R2, and the alpha counter AC each include a latching input LR1, LR2, and LAC. When set to a logical "1" for a period of time, the latching inputs LR1, LR2, and LAC cause a value to be read from the read bus to the respective register R1, R2 or alpha counter AC. In addition to the first and second registers R1 and R2 are third, fourth, and fifth registers R3, R4, and R5, each with a respective latching input LR3, LR4, and LR5. The alpha counter AC also includes an increment input INC that causes the value held by the alpha counter AC to count in the Galois field accordingly.

The Galois field computation unit 206 also includes first, second, third, fourth, fifth, sixth and seventh multiplexers M1, M2, M3, M4, M5, M6, and M7. Each of the multiplexers M1–M7 includes a respective control input C1–C7. The output of the first register R1 is applied to inputs of the first and second multiplexers M1 and M2 as shown. The output of the second register R2 is applied to inputs of the first, third, and sixth multiplexers M1, M3, and M6 as shown. The outputs of the second and third multiplexers M2 and M3 are applied to a multiplier 319. The output of the multiplier 319 is in turn applied to first and second adders 323 and 326. The output of the first multiplexer M1 is applied to the first adder 323. The output of the first adder 323 is applied to the third register R3, the output of which is coupled to an input of the second and sixth multiplexers M2 and M6.

The second adder 326 also receives an input from the output of the fourth multiplexer M4 and generates an output which is applied to an input of register R4. The output of the fourth register R4 is applied to an input of the sixth multiplexer as well as input to the third, fourth and fifth multiplexers M3, M4, M5. A second input of the fourth multiplexer M4 is coupled to a logical "0" as shown. The output of the alpha counter AC is applied to both inputs of the third multiplexer M3 and the fifth multiplexer M5.

The output of the fifth multiplexer M5 is coupled to a Galois field inverter 329, the output of which, in turn, is applied to register R5. The output of register R5 is thereafter applied to inputs of multiplexers M3 and M6 as shown. The sixth multiplexer M6 also includes an input coupled to the parallel multiply accumulator 203 (FIG. 4) from which the syndrome array 156 (FIG. 3) is received, as well as inputs coupled to a constant value of "1", a constant value of "0", and an output from the alpha counter AC. The output of the sixth multiplexer is coupled to the write bus 306 as shown. The seventh multiplexer M7 has inputs coupled to a constant value of "0", a constant value of "1", and the memory 309. In effect, the seventh multiplexer M7 controls what is written to the read bus 303.

The Galois field computation unit 206 further includes a data buffer/correction circuit 333 which generates a data output as shown. The data buffer correction circuit 333 includes an input which is coupled to the read bus 303. The data buffer correction circuit 333 is generally a logical circuit that executes the correct data routine 183 (FIG. 4), receiving data from the read bus 303.

Also included is an address generator 336 which is coupled to the memory 309 and also includes an input from and an output to the RS decoder 209 (FIG. 4). The address generator 336 generates various control flag bits and memory addresses employed during the operation of the present invention.

The operation of the RS decoder 200 is controlled by the RS decoder controller 209 (FIG. 4) that generally comprises state machinery that manipulates the various control inputs of the Galois field computation unit 206, etc. The following discussion tracks the general operation of the RS decoder controller 209 in terms of the state diagrams mentioned with reference to FIG. 4 as the RS decoder controller 209 manipulates the Galois field computation unit 206 in order to perform the various algorithms described with reference to FIG. 3. In particular, the control inputs C1–C7 are manipulated thereby controlling the multiplexers M1–M7 thereby establishing various data paths in coordination to place the logical circuit 316 in one of a number of data calculation configurations to perform the various calculations during the RS decoding. These data calculation configurations include a multiply accumulation configuration, a recursive multiplication function, a produce operation configuration, a division configuration, and a memory shifting configuration as well as other configurations. These configurations are discussed in the context of the following state diagrams.

Figure 7:
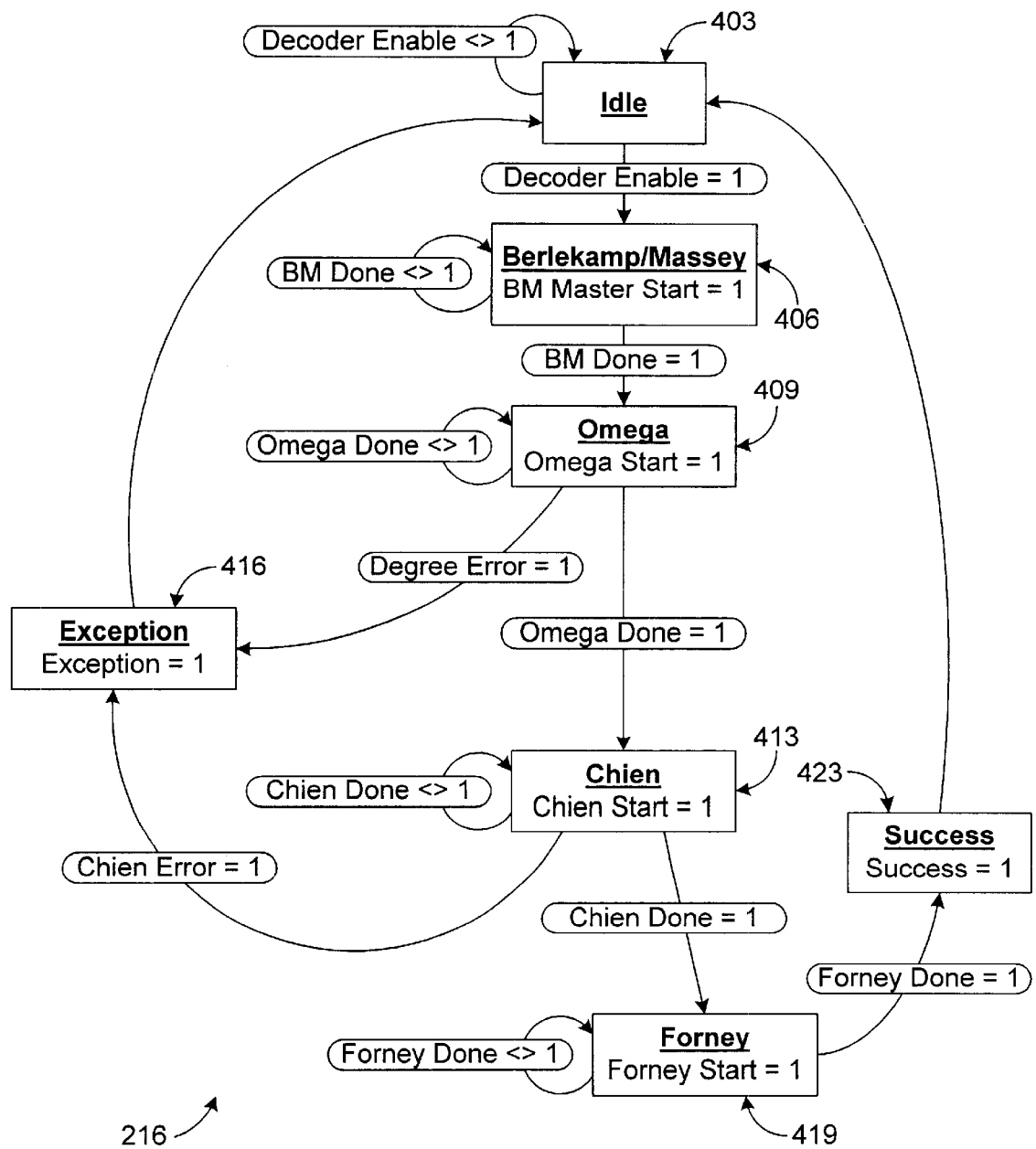
FIG. 7 is a state diagram of a global state machine employed in a Reed-Solomon controller in the Reed-Solomon decoder of FIG. 4.

With reference to FIG. 7, shown is a state diagram of the overall operation of the global state machine 216. The global state machine 216 generally enables a number of algorithm specific state machines thereby controlling the overall RS decoding process. The global state machine 216 begins at an idle state 403 in which it is determined whether a decoder enable bit is set to a logical "1". If not, then the global state machine 216 remains at the idle state 403. If the decoder enable bit is equal to a logical "1", then the global state machine progresses to a Berlekamp-Massey (BM) state 406. The decoder enable bit is generally set by a start signal received when a data stream is applied to the RS decoder 200. When in the BM state 406, the global state machine 216 sets a BM start bit to a logical "1", thereby enabling the BM master state machine 219. The BM master state machine 219 in turn controls the BM slave state machine 223, and, together, the joint operation of both state machines facilitate the execution the Berlekamp-Massey algorithm 159 (FIG. 3).

The global state machine 216 remains in the BM state 406 as long as a BM done bit is not equal to a logical "1". If, on the other hand, the BM done bit is equal to a logical "1", then the global state machine 216 moves to the omega state 409. In the omega state, an omega start bit is set to a logical "1", thereby enabling the omega state machine 226. Thereafter, if an omega done bit set by the omega machine 226 does not equal a logical one, then the global state machine 216 remains in the omega state 409. If the omega done bit is set equal to a logical "1", thereby indicating the end of the operation of the omega state machine 226, then the global state machine 216 progresses to the Chien state 413. In addition, if in the omega state 409 a degree error bit is set equal to a logical "1" that is the exception condition of the Berlekamp-Massey algorithm 159, then the global state machine 216 progresses to an exception state 416. The degree error bit generally indicates that there are more errors in the n symbol code word than the current configuration can correct.

Upon reaching the Chien state 413, the global state machine 216 sets a Chien start bit equal to a logical "1", thereby enabling the operation of the Chien state machine 229. Generally, the Chien state machine 229 controls the execution of the Chien algorithm 169 (FIG. 3). If, during the Chien state 413, a Chien done bit is set equal to a logical "1" indicating that the Chien state machine 229 has completed operation, then the global state machine progresses to a Forney state 419. If, while in the Chien state 413, the Chien done bit does not equal one, then the global state machine 216 remains in the Chien state 413. In addition, if a Chien error bit is set to a logical "1" while the global state machine 216 is in the Chien state 413, then the global state machine 216 reverts to the exception state 416 in which an exception bit is set equal to one. Note that the exception state 416 indicates that the n symbol codeword 126 cannot be corrected. Thereafter, the global state machine 216 reverts back to the idle state 403.

Upon entering the Forney state 419, a Forney start bit is set equal to a logical "1" that enables the operation of the Forney state machine 231. Note that the Chien and Forney state machines contain a few similar operations. In the preferred embodiment, common operations of the Chien and Forney state machines 229 and 231 are combined in single state machine to gain economies of operation. If while in the Forney state 419, the Forney done bit is not equal to a logical "1", then the global state machine 216 remains in the Forney state 419. However, should the Forney done bit is set equal to a logical "1", thereby indicating that the Forney state machine has finished its tasks, the global state machine 216 progresses to a success state 423. In the success state, a success bit is set equal to a logical "1" and thereafter, the global state machine 216 reverts back to the idle state having completed the correction of the end symbol code word in question.

Figure 8A:
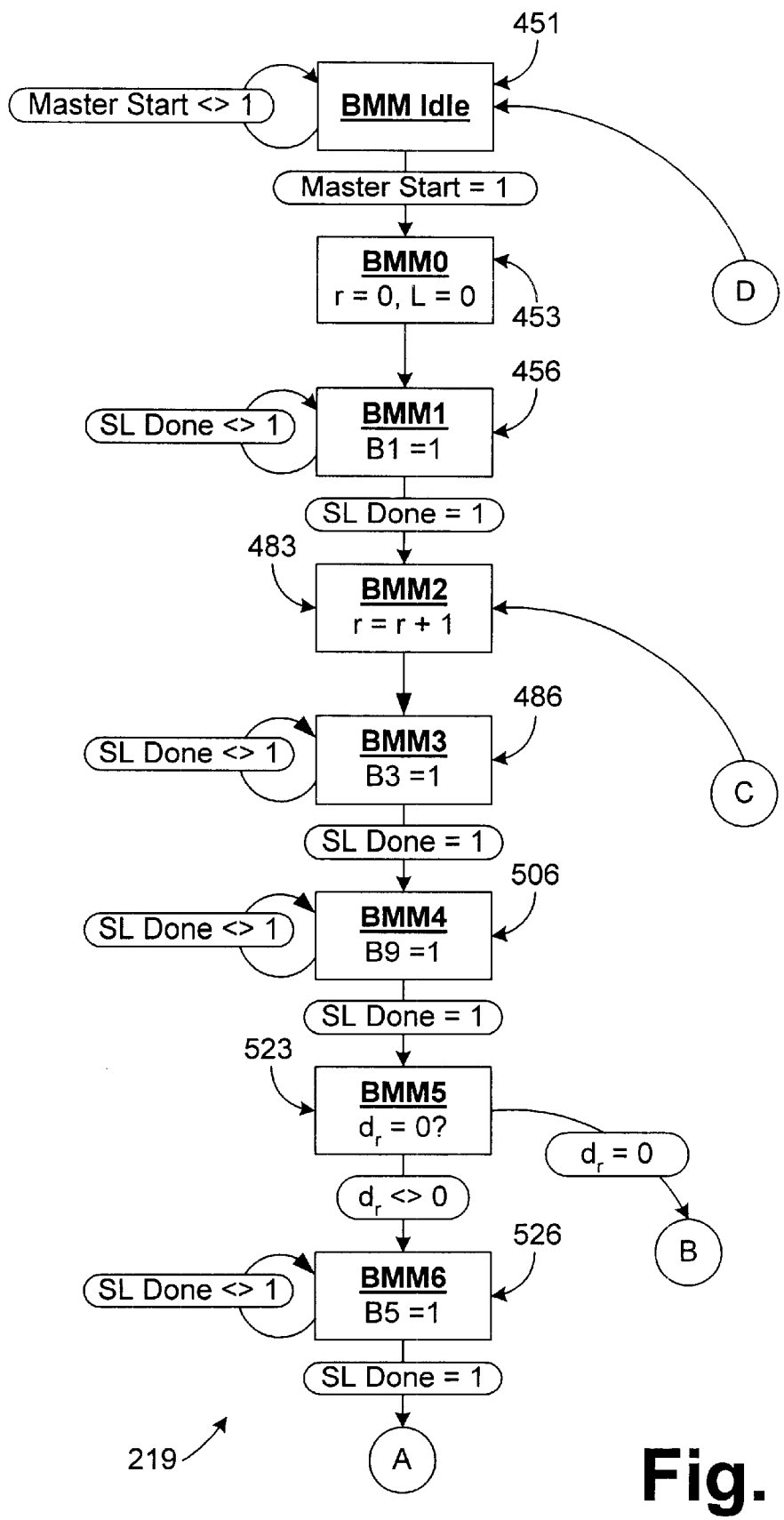
FIGS. 8A–8B are collectively a state diagram of a Berlekamp-Massey master state machine employed in the Reed-Solomon controller in the Reed-Solomon decoder of FIG. 4.
Figure 8B:
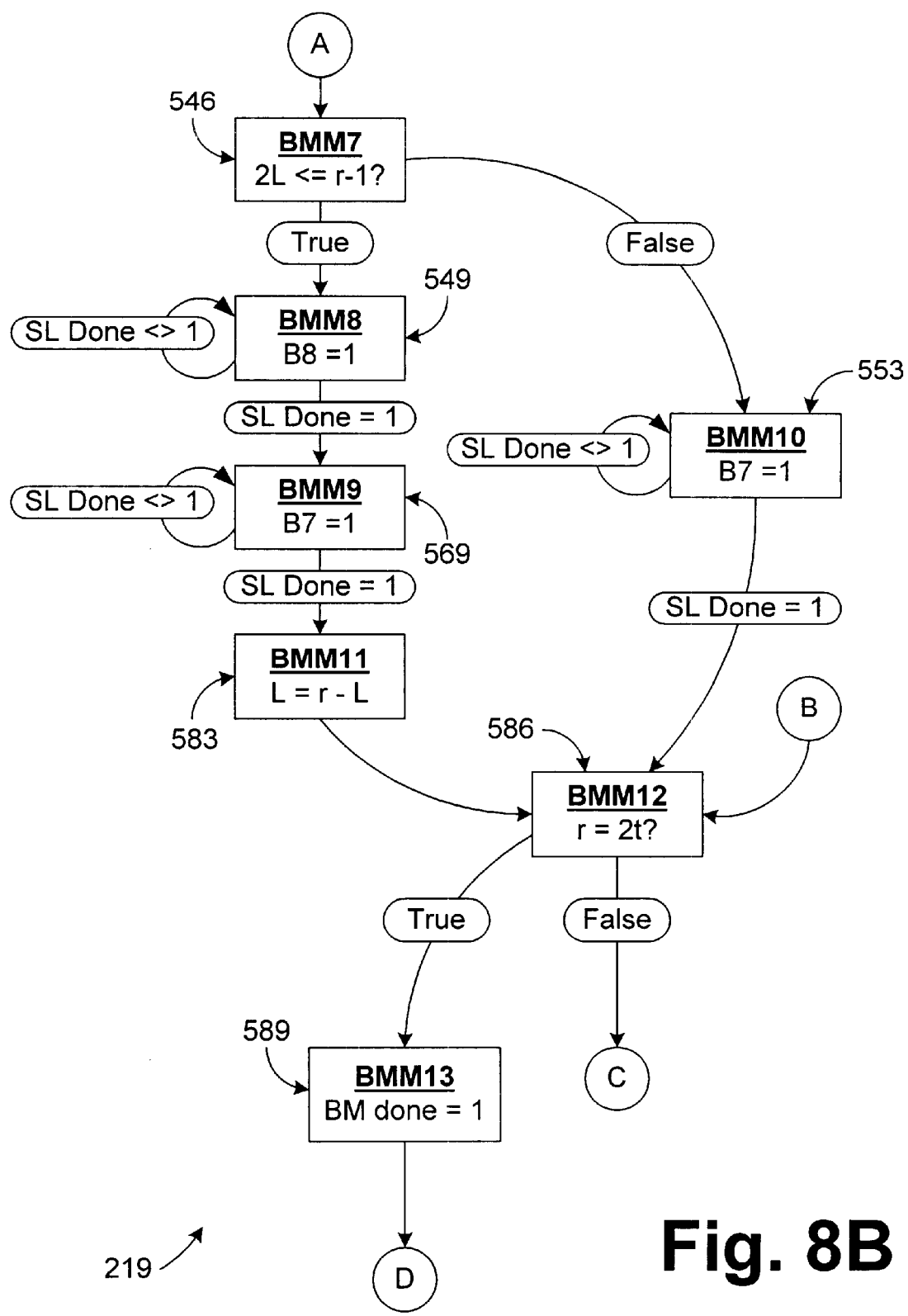

Turning then, to FIGS. 8A and 8B, shown is a state diagram of the BM master state machine 219 (hereafter "BM master 219") enabled by the global state machine 216 (FIG. 7). During operation, the BM master 219 enables various functions in the Berlekamp-Massey slave state machine 223 (hereafter "BM slave 223") of FIGS. 9A–9G as will be discussed. The following discussion will introduce the various drawings out of order as discussion follows the sequential operation of both of these state machines.

The BM master 219 begins at the BM master idle state 451 where a master start bit is examined. If the master start bit is equal to a logical "1", then the BM master 219 moves to a BMM0 state 453. If not, then the BM master 219 remains in the master idle state 451. In the BMM0 state 453, two loop control variables, r and L, are set equal to "0". Thereafter, the BM master 219 progresses to a BMM1 state 456. In the BMM1 state 456, a variable B1 is set equal to a logical "1" that enables an initialization function in the BM slave 223.

Figure 9A:
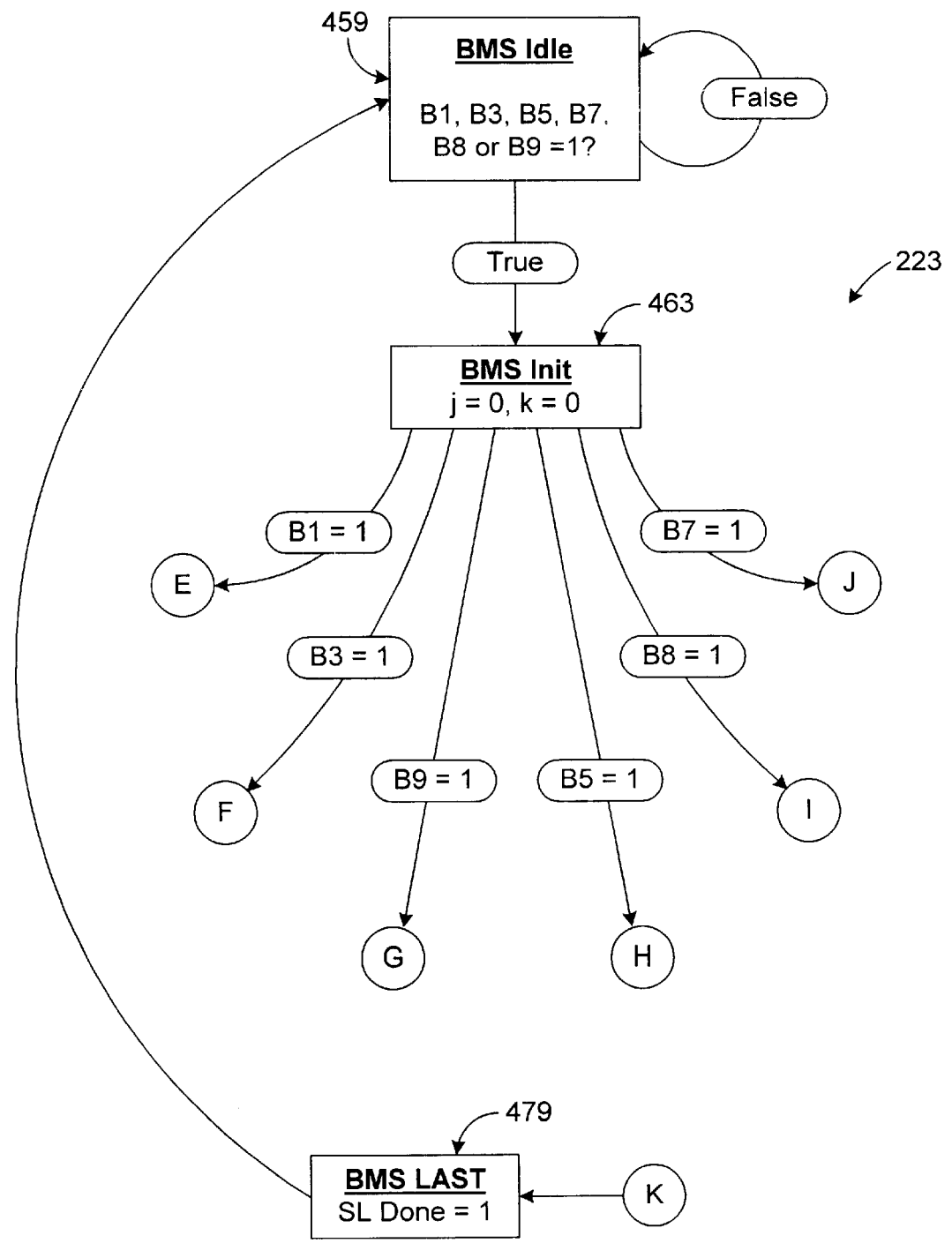
FIGS. 9A–9G are collectively a state diagram of a Berlekamp-Massey slave state machine employed in the Reed-Solomon controller in the Reed-Solomon decoder of FIG. 4.

Turning then, to FIG. 9A, shown is a beginning portion of the BM slave 223. The BM slave 223 begins in the BM slave idle state 459 in which a number of variables are examined, including B1, B3, B5, B7, B8, or B9, to see if any are set equal to a logical "1". If this is the case then the BM slave 223 progresses to the BM slave initialization state 463 in which variables j and k are set equal to zero. Thereafter, the BM slave 223 will leave the slave initialization state 463 when one of the above mentioned variables, namely B1, B3, B5, B7, B8, or B9 is set equal to a logical "1". Providing the variable B1 was set equal to a logical "1" in BMM1 state 456 (FIG. 8A), then the BM slave 223 progresses to the connector E.

Figure 9B:
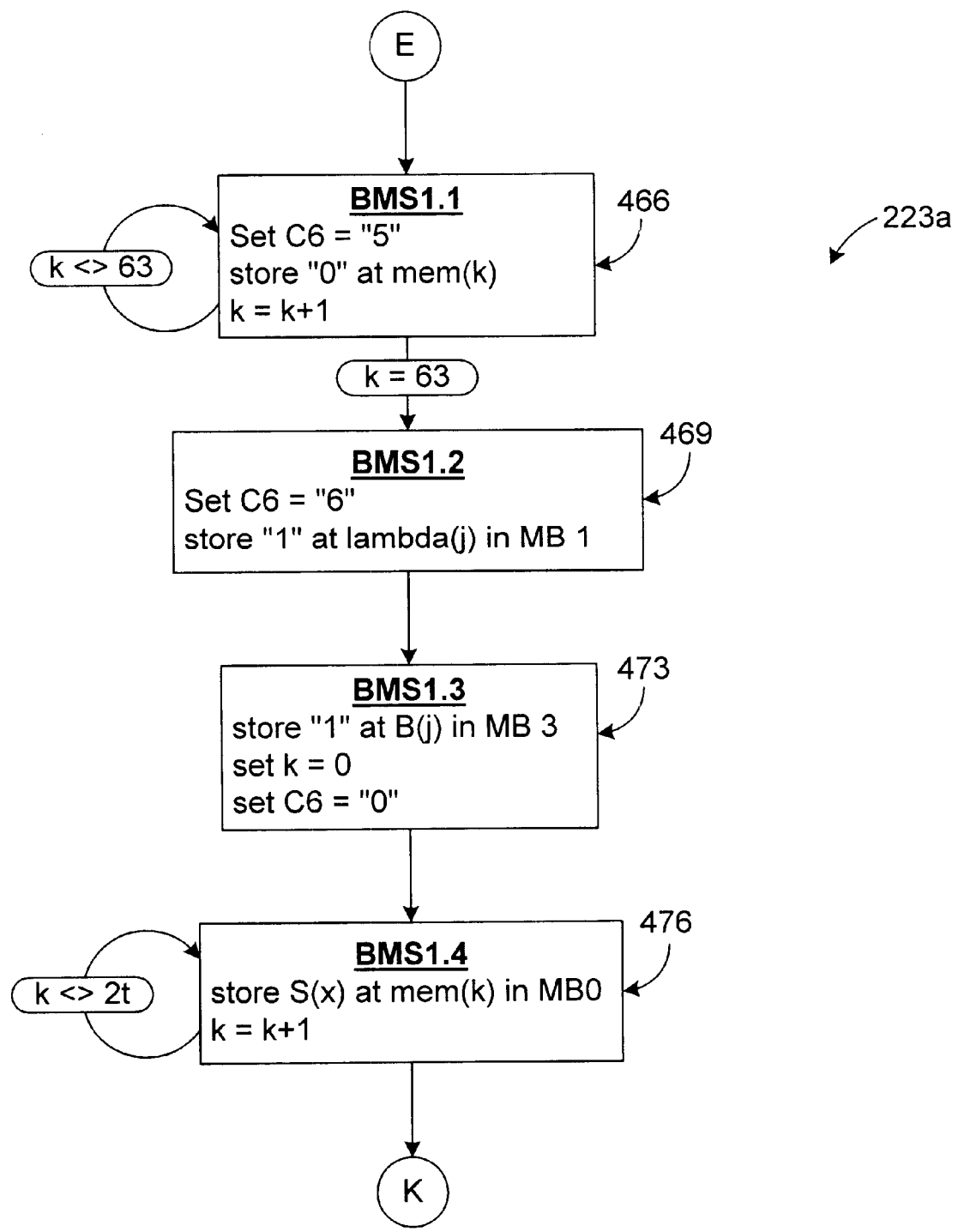

With reference to FIG. 9B, shown is a first branch 223a of the BM slave 223. The first branch 223a begins at BMS1.1 state 466 in which the memory 309 (FIG. 6) is cleared. Specifically, the control input C6 is set equal to "5" and a loop is executed in which the k variable is incremented and a zero is stored at each memory location mem(k). This clears the memory 309 for future use. The loop continues to execute until k=63, where the first branch 223a progresses to a BMS1.2 state 469.

In the BMS1.2 state 469, the control input C6 is set equal to "6", thereby placing a value "1" a logical "1" is stored in the second memory bank MB1 of the memory 309(FIG. 6). This value is the first coefficient in an error location polynomial λ(x) that is generated by the Berlekamp-Massey algorithm 159. The coefficients of this error location polynomial λ(x) are stored in the error locator array 163 (FIG. 3) which is denoted lambda(x).

Thereafter, the first branch 223a moves to a BMS1.3 state 473 in which a logical "1" is stored in the memory bank MB3. This value is the first coefficient in an temporary array B(x) that is generated by the execution of the Berlekamp-Massey algorithm 159. Thereafter, the variable k is set equal to zero and the control signal C6 of the sixth multiplexer M6 is set equal to zero. This action makes the syndrome array 156 (FIG. 3) received from the parallel multiply accumulator 203 (FIG. 4) available on the write bus 306. The first branch 223a then progresses to the BMS1.4 state 476 in which a loop is executed to write each value of the syndrome array 156 to the first memory bank MB0, where there are 2t values in the syndrome array 156. Thereafter, the first branch 223a ends at connector K and reverts back to the BM slave 223 (FIG. 9A).

Turning once again to FIG. 9A, the BM slave 223 enters the BMS last state 479 in which a slave done bit is set equal to a logical "1". Thereafter, the BM slave 223 reverts back to the slave idle state 459.

Referring back to FIG. 5A, once the slave done bit is set to a logical "1", the BM master 219 progresses to the BMM2 state 483. In the BMM2 state 483, the variable r is incremented. The variable r is used to control a loop that ends when r=2t as will be seen, the loop controlling various portions of the Berlekamp-Massey algorithm 159 (FIG. 3).

Thereafter, the BM master 219 moves to the BMM3 state 486 in which the variable B3 is set to a logical "1", thereby enabling the calculation of a delta variable $d_r$ according to the Berlekamp-Massey algorithm 159 (FIG. 3). The BM master 219 remains in the BMM3 state 486 while the slave done bit is not set equal to a logical "1". The delta variable $d_r$ is defined as $$d_r = \sum_{i=0}^{L} \lambda(i)S(r-i-1),$$

where S(x) represents the values in the syndrome array and λ(x) are the values of the coefficients of a lambda polynomial.

Referring once again to FIG. 9A, once the variable B3 is set to a logical "1", the BM slave 223 progresses from the BM slave idle state 459 and through the BM slave initialization state 463 to connector F.

Figure 9C:
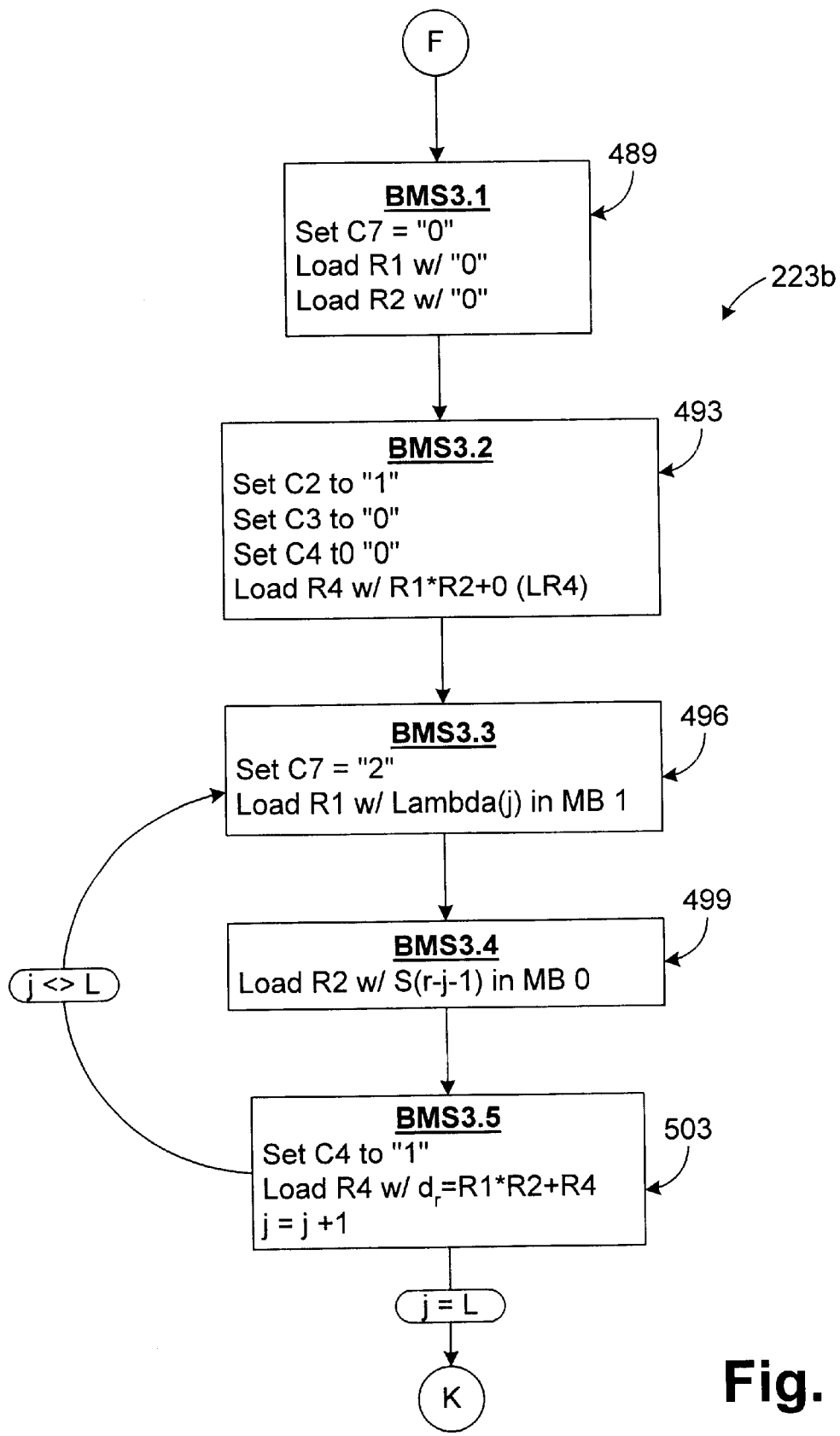

Turning to FIG. 9C, shown is a second branch 223b of the BM slave 223 where, beginning at the connector F, the BM slave 223 progresses to BMS3.1 state 489 in which the control input C7 is set equal to "0" and a zero value is loaded into the first and second registers R1 and R2. Note that for the following discussion, when a value is "loaded" into one of the registers R1–R5, it is done by momentarily setting the appropriate latching input LR1–LR5 to a logical "1". Thereafter, the BM slave 223 moves to a BMS3.2 state 493 in which control input C2 is set to a logical "1" and control inputs C3 and C4 are both set to a logical "0". The register R4 is then loaded with the value R1*R2+0, which is zero, thereby initializing the register R4.

Thereafter, the BM slave 223 progresses to a BMS3.3 state 496 in which the control input C7 is set equal to "2" and the first register R1 is loaded with one of the coefficients from the lambda polynomial λ(x). The BM slave 223 then progresses to a BMS3.4 state 499 where the second register R2 is loaded with one of the values in the syndrome array 156 (FIG. 3). The BM slave 223 moves to a BMS3.5 state 503 in which the control input C4 is set equal to a logical "1" and, register R4, which maintains the value of the delta variable $d_r$, is loaded with R1*R2+R4. Thereafter, the variable j is incremented by 1. The BM slave 223 then reverts back to the BMS3.3 state 496 if the variable j does not equal the variable L which is a variable that is set to zero in the BMM0 state 453 (FIG. 8A) and increased appropriately by the BM master 219. If the variable j equals the variable L, then the BM slave 223 moves back to the BMS last state 479 where the slave done bit is set equal to a logical "1". Thereafter, the BM slave 223 reverts back to the slave idle state 459.

Meanwhile, with reference back to FIG. 8A, when the slave done bit is set equal to logical "1", the BM master 219 progresses from the BMM3 state 486 to a BMM4 state 506. In the BMM4 state 506, the variable B9 is set equal to a logical "1", thereby enabling the shifting of the coefficients of a beta polynomial stored in memory bank MB3 (FIG. 6).

Referring once again to FIG. 9A, once the variable B9 is set to a logical "1", the BM slave 223 progresses from the BM slave idle state 459 and through the BM slave initialization state 463 to connector G.

Figure 9D:
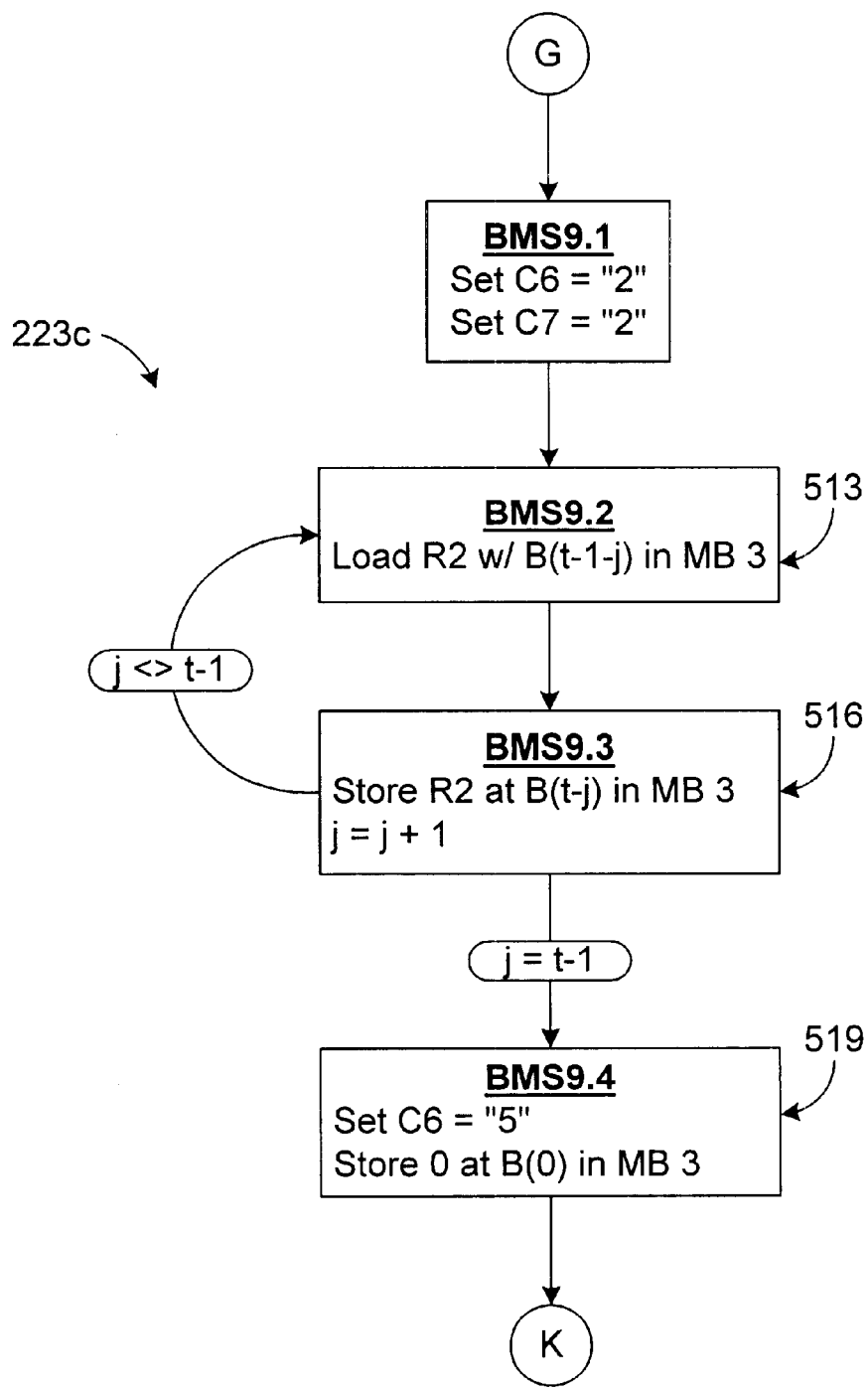

Turning then, to FIG. 9D, shown is a third branch 223c of the BM slave 223 where, beginning at the connector G, the BM slave 223 moves to a BMS9.1 state 509 in which the control input C6 is set equal to "2", thereby placing the output of the second register R2 onto the write bus 306, and the control input C7 is set equal to "2", thereby placing the output of the memory 309 onto the read bus 303. Thereafter, the BM slave 223 progresses to a BMS9.2 state 513 in which the second register R2 is loaded with one of the coefficients of the beta polynomial B(t−1−j) from memory bank MB3, where j is a loop variable. Then, in a BMS9.3 state 516, the value just loaded into the second register R2 is stored at the location of beta polynomial coefficient B(t−j) in memory bank MB3 and the variable j is incremented. If in the BMS9.3 state 516, the variable j is not equal to t−1, then the BM slave 223 reverts back to the BMS9.2 state 513. Otherwise, the BM slave 223 moves to a BMS9.4 state 519 in which the control input C6 is set equal to "5", thereby placing a zero value on the write bus 306, and a zero is written to the beta coefficient B(0) in memory bank MB3. Then, the BM slave 223 moves to the connector K and, thereafter, to the BMS last state 479 (FIG. 9A) where the slave done bit is set equal to a logical "1". Thereafter, the BM slave 223 reverts back to the slave idle state 459 (FIG. 9A).

Referring back to FIG. 8A, when the slave done bit is set equal to a logical "1" while the BM master 219 was in the BMM4 state 506 during the execution of the third branch 223c (FIG. 9D), the BM master 219 progresses to a BMM5 state 523. In the BMM5 state 523, the delta variable $d_r$ is compared with zero. If the delta variable $d_r$ is not equal to zero, then the BM master 219 moves to a BMM6 state 526. Otherwise, the BM master 219 progresses to connector B to FIG. 8B.

In the BMM6 state 526, a variable B5 is set equal to a logical "1" that enables the calculation of a temporary array T(x) by the BM slave 223, the temporary array T(x) being used in performing the Berlekamp-Massey algorithm 159 (FIG. 3). Referring once again to FIG. 9A, once the variable B5 is set to a logical "1", the BM slave 223 progresses from the BM slave idle state 459 and through BM slave initialization state 463 to connector H.

Figure 9E:
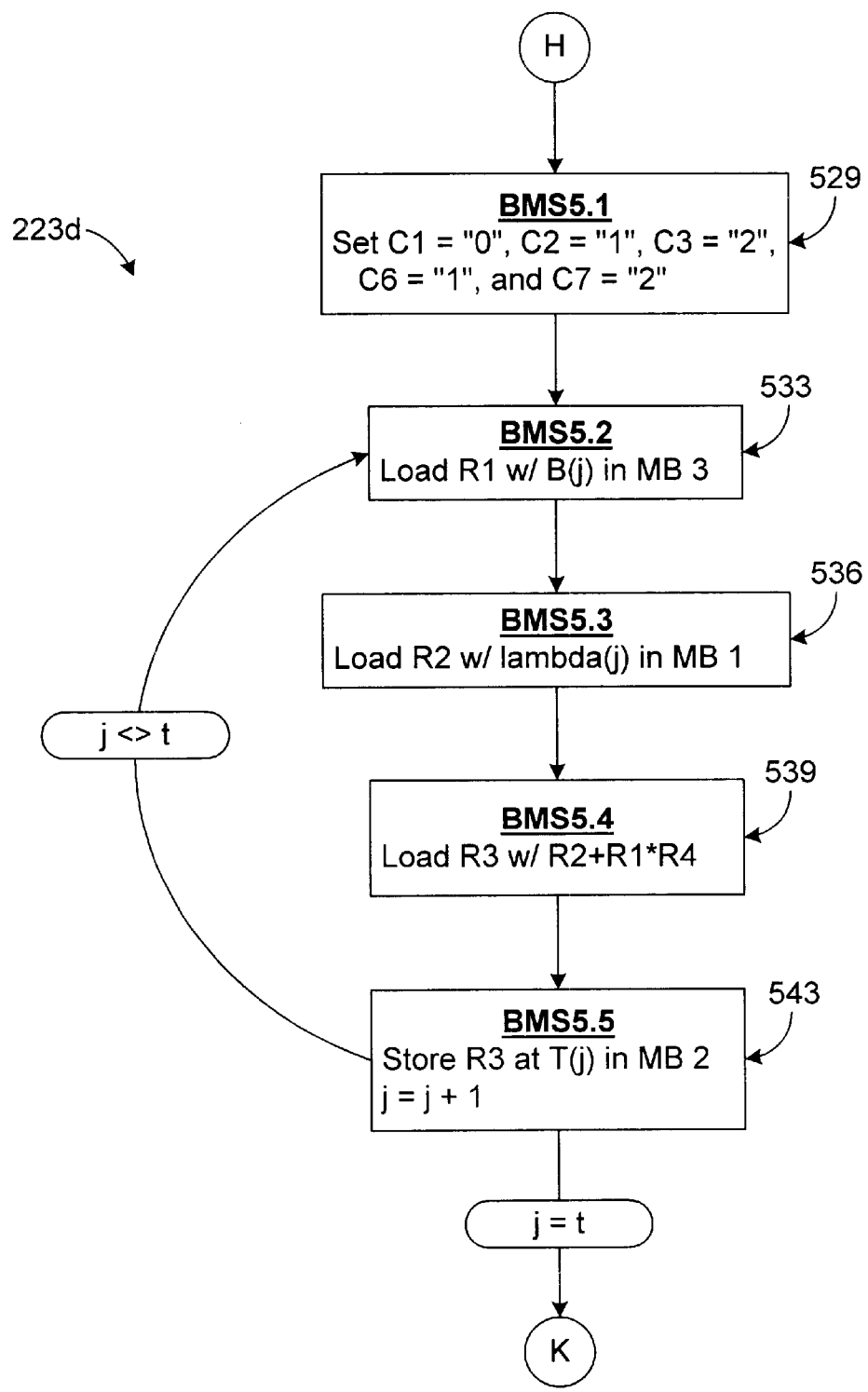

Turning then, to FIG. 9E, shown is a fourth branch 223d of the BM slave 223. Beginning at connector H, the BM slave 223 progresses to a BMS5.1 state 529 in which the control inputs are set as follows: C1 is set to "0", C2 and C6 are set to "1", and C3 and C7 are set to "2". Then, the BM slave 223 moves to a BMS5.2 state 533 in which a beta coefficient B(j) is loaded into the first register R1 from memory bank MB3. Thereafter, in a BMS5.3 state 536, a lambda coefficient λ(j) is loaded into the second register R2 from memory bank MB1. Next, in a BMS5.4 state 539, a single value in the temporary array T(j) is calculated by loading a value into the third register R3 that equals R2+R1*R4. Then, in a BMS5.5 state 543, the newly generated value for the temporary array T(j) is stored in memory bankMB2 and the variable j is incremented by one. At this point, if the variable j is not equal to t, then the BM slave 223 reverts back to the BMS5.2 state 533. This loop continues until the entire temporary array T(j) is generated and stored in the memory bank MB2. If the variable j is equal to t, then the BM slave 223 moves to the connector K. Thereafter, BM slave 223 moves back to the BMS last state 479 (FIG. 9A) where the slave done bit is set equal to a logical "1". Thereafter, the BM slave 223 reverts back to the slave idle state 459 (FIG. 9A).

Turning back to FIG. 8A, in the BMM6 state 526, once the slave done bit is set to a logical "1" after executing the fourth branch 223d (FIG. 9E), the BM master 219 progresses to connector A.

With reference to FIG. 8B, the BM master 219 continues from the connector A to a BMM7 state 546 in which a comparison is made to determine whether 2L<xr−1. If this equation is true, then the BM master 219 progresses to a BMM8 state 549. If the equation is false, then the BM master progresses to a BMM10 state 553. In the BMM8 state 549, the variable B8 is set equal to a logical "1" thereby enabling the calculation of the coefficients for the beta polynomial B(x). Thereafter, the BM master 219 remains in the BMM8 state 549 until the slave done bit is set equal to a logical "1".

Referring once again to FIG. 9A, once the variable B8 is set to a logical "1", the BM slave 223 progresses from the BM slave idle state 459 and through the BM slave initialization state 463 to connector I.

Figure 9F:
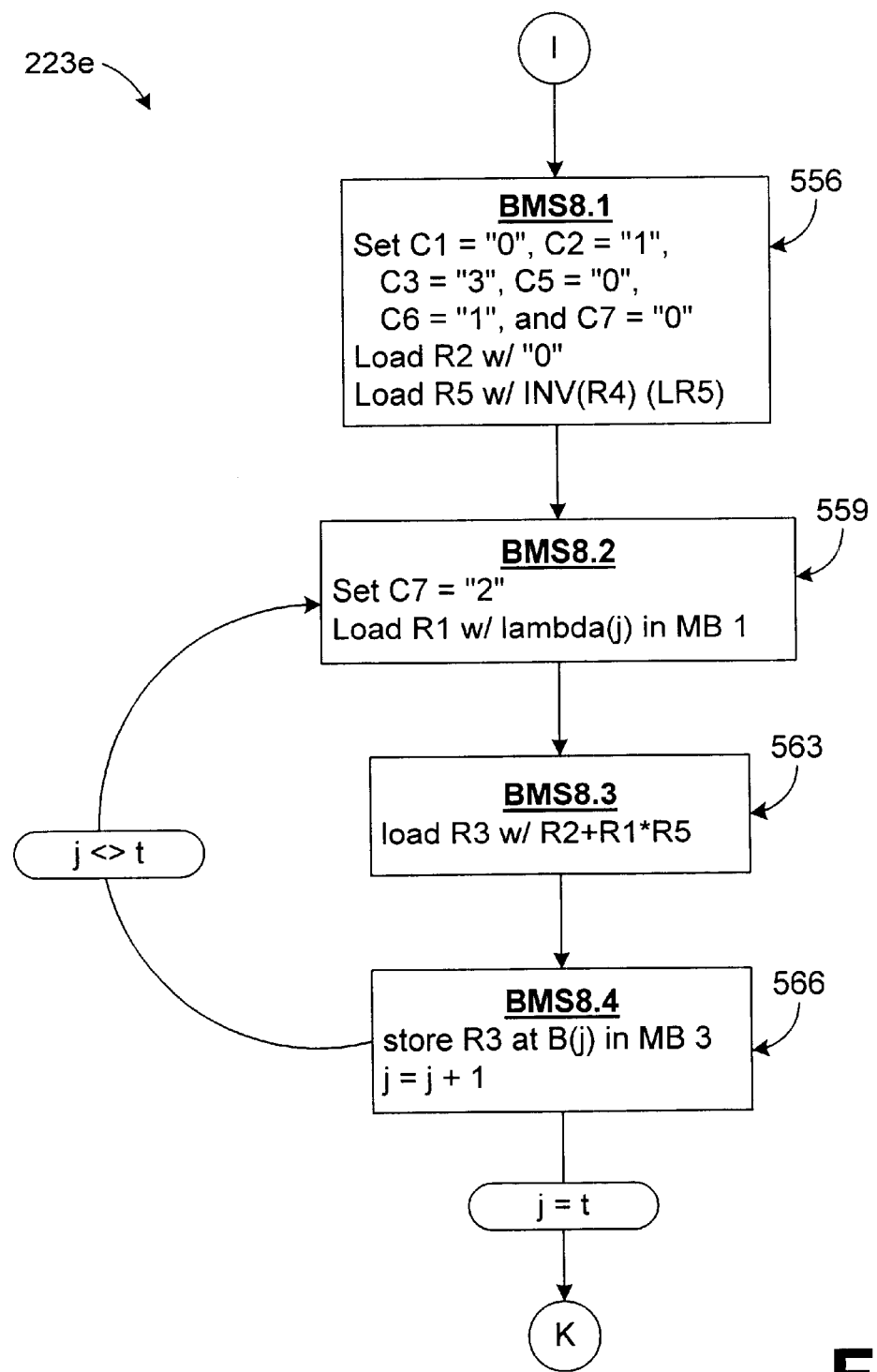

With reference to FIG. 9F, shown is a fifth branch 223e of the BM slave 223. Beginning with the connector I, the BM slave 223 progresses to a BMS8.1 state 556 in which the second register R2 is loaded with a "0", control inputs C1, C5, and C7 are set to "0", control inputs C2 and C6 are set to "1", control input C3 is set to "3", and the fifth register R5 is loaded with the inverse value of the fourth register R4. Thereafter, the BM slave 223 moves to a BMS8.2 state 559 in which the control input C7 is set equal to "2", thereby placing the output of the memory 309 onto the read bus 303. Also, the first register R1 is then loaded with a coefficient of the lambda polynomial λ(j) from memory bank MB1. Then, in a BMS8.3 state 563, a beta coefficient B(j) is generated by loading the third register R3 with R2+R1*R5, which is the multiplication of an appropriate lambda polynomial λ(j) and the inverse of the delta variable $d_r$ stored in the fifth register given that the value held in the second register R2 is equal to zero. Next, in a BMS8.4 state 566, the Beta coefficient B(j) is stored in memory bank MEB3 and the variable j is incremented by one. At this point, the BM slave 223 reverts back to the BMS8.2 state 559 if j is not equal to t. Otherwise, the BM slave 223 moves on to connector K and back to the BMS last state 479 (FIG. 9A) where the slave done bit is set equal to a logical "1". Thereafter, the BM slave 223 reverts back to the slave idle state 459 (FIG. 9A).

With reference once again to FIG. 8B, once the slave done bit is set equal to a logical "1" while the BM master 219 is in the BMM8 state 549, the BM master 219 progresses to a BMM9 state 569 in which the variable B7 is set to a logical "1". The same occurs if the BM master 219 enters the BMM10 state 553. Setting the variable B7 to a logical "1" enables a transfer function in which the temporary array T(x) in memory bankMB2 becomes the new lambda coefficients λ(x) stored in memory bank MB1. This is accomplished by transferring the values in memory bank MB2 to memory bank MB1 as is discussed.

Referring once again to FIG. 9A, once the variable B7 is set to a logical "1", the BM slave 223 progresses from the BM slave idle state 459 and through the BM slave initialization state 463 to connector J.

Figure 9G:
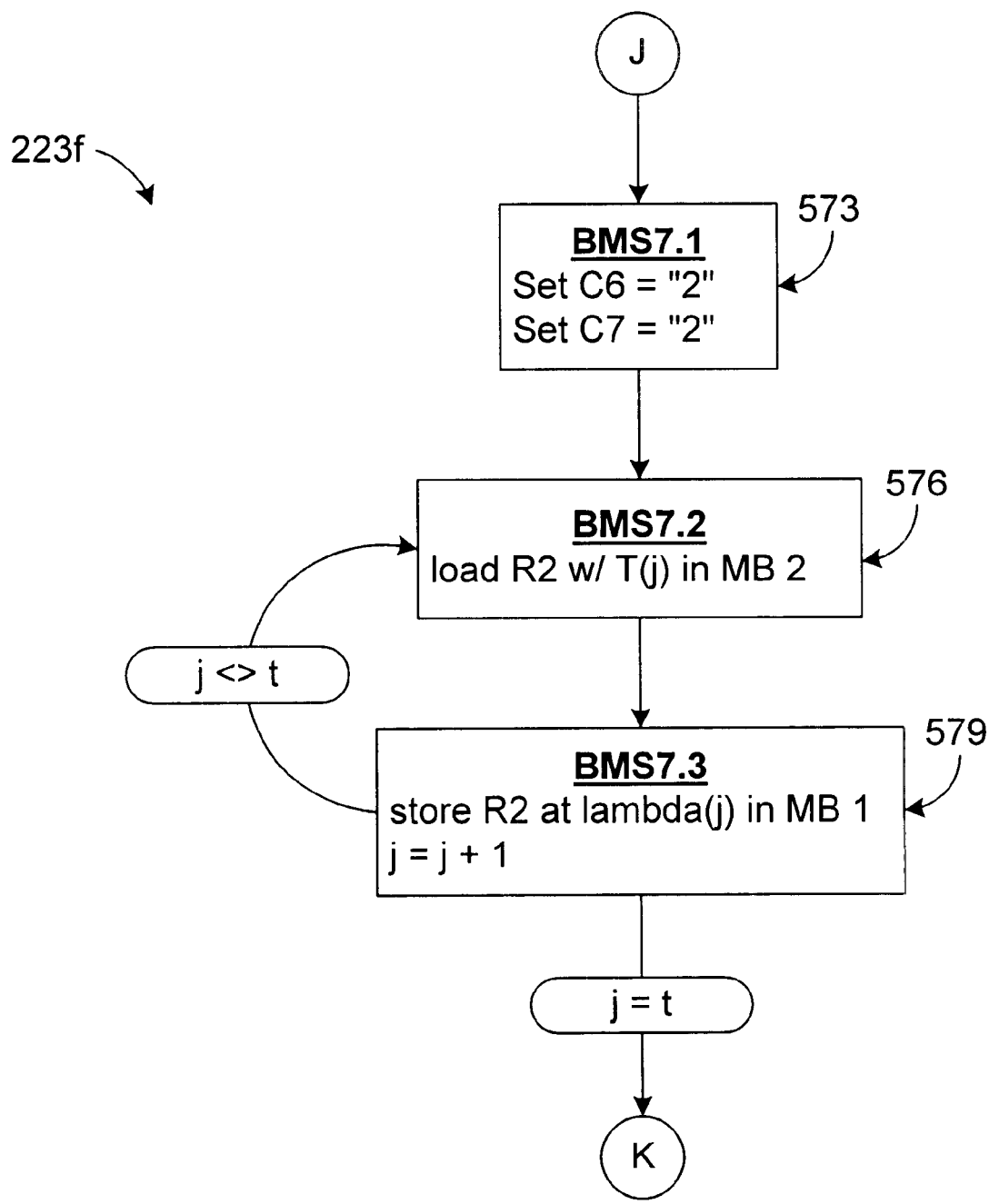

Thereafter, with reference to FIG. 9G, shown is a sixth branch 223f of the BM slave 223. The BM slave 223 begins at the connector J and enters a BMS7.1 state 573 in which the control inputs C6 and C7 are set equal to "2". Thereafter, in a BMS7.2 state 576, the second register R2 is loaded with one of the values in the temporary array T(j) from memory bankMB2. Then, in a BMS7.3 state 579, the values just loaded into the second register R2 is stored in an appropriate location in memory bank MB1 that stores the Lambda coefficients λ(x). Next, in the BMS7.3 state 579, the variable j is incremented by one. If the incremented value of j is not equal to t, then the BM slave 223 reverts back to the BMS7.2 state 576. Otherwise, the BM slave 223 moves on to connector K and back to the BMS last state 479 (FIG. 9A) where the slave done bit is set equal to a logical "1". Thereafter, the BM slave 223 reverts back to the slave idle state 459 (FIG. 9A).

Turning back to FIG. 8B, once the slave done bit is set to a logical "1" while the BM master 219 is in the BMM9 state 569, then the BM master 219 moves on to a BMM11 state 583 in which the variable L is calculated where L=r–L. Thereafter, the BM master 219 proceeds to a BMM12 state 586. In addition, while in the BMM10 state 553, if the slave done bit is set to a logical "1", then the BM master 219 progresses to the BMM12 state 586 as well.

In the BMM12 state 586 an inquiry is made to see if r=2t, indicating that a correctable n symbol codeword with errors has been detected. If so, then the BM master 219 proceeds to a BMM13 state 589 in which the BM done bit is set equal to logical "1" and the BM master 219 then moves to connector D and ultimately back to the BMM idle state 451 (FIG. 8A). If r does not equal 2t, then the BM master 219 moves through connector C to the BMM2 state 483 (FIG. 8A) where further action is taken as discussed above.

Referring back to FIG. 7, when the BM done bit is set to a logical "1" while the global state machine 216 is in the Berlekamp-Massey state 406, then the global state machine 216 progresses to the Omega state 409 that enables the operation of the Omega state machine 226 (FIG. 4). While in the Omega state 409, an Omega start bit is set equal to a logical "1", thereby enabling the operation of the Omega state machine 226 that calculates the coefficients of the omega polynomial $\Omega(x)$ within the error evaluator array 166 (FIG. 3) and stores them in memory bank MB2. The omega polynomial $\Omega(x)$ may be calculated for Reed-Solomon decoding with either a DMT line code or a CAP line code (where CAP may include, for example, a QAM line code), where the modulation type bit determines whether a DMT line code is used as opposed to a CAP/QAM line code. It is understood that the present invention may encompass other modulation schemes as well.

Figure 10A:
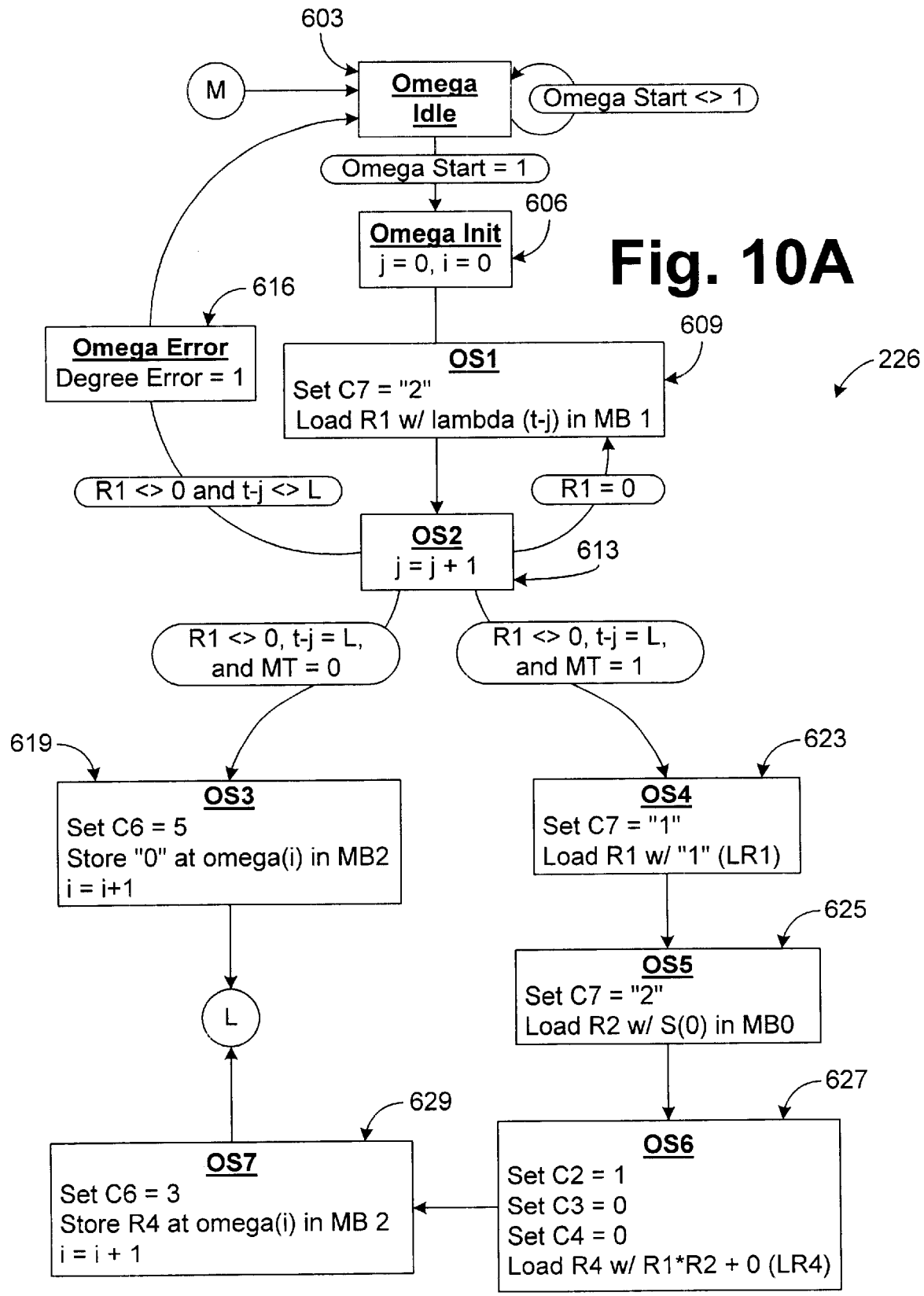
FIGS. 10A–10B are collectively a state diagram of an Omega state machine employed in the Reed-Solomon controller in the Reed-Solomon decoder of FIG. 4.

With reference to FIG. 10A, shown is the omega state machine (OSM) 226 that begins in an Omega idle state 603. When the Omega start bit is set equal to a logical "1", then the OSM 226 progresses to an omega initialization state 606 in which variables j and i are set equal to zero. Thereafter, the OSM 226 continues at an OS1 state 609 in which the control input C7 is set equal to "2" and the first register R1 is loaded with $\lambda(t-j)$ from memory bank MB1 to determine whether a degree error exists such that there are more errors in the n symbol codeword received by the RS decoder 200 (FIG. 4) than can be corrected.

Next, the OSM 226 continues to an OS2 state 613 in which the variable j is incremented by one. At this point, if the value held by the first register R1 is equal to zero, then the OSM 226 reverts back to the OS1 state 609 where the next coefficient of the lambda polynomial $\lambda(t-j)$ is loaded into the first register. On the other hand, if the value held by the first register R1 does not equal zero, then three different possibilities exist. First, if R1<>0 and if t–j<>L, then the OSM 226 moves to an Omega error state 616 in which a degree error bit is set equal to a logical "1". Secondly, if R1<>0, t–j=L, and the modulation type bit=0, then the OSM 226 continues to an OS3 state 619. Finally, in the third possibility where R1<>0, t–j=L, and the modulation type bit=1, then the OSM 226 proceeds to an OS4 state 623.

In the case where the OSM 226 moves to the Omega error state 616, a degree error bit is set equal to a logical "1", thereby indicating that there are more errors in the n symbol codeword than the RS decoder 200 is capable of correcting. Thereafter, the OSM 226 reverts back to the idle state 603.

In the second case where the OSM 226 has continued to an OS3 state 619, then the control input C6 is set equal to "5", a value of zero is stored as the omega polynomial coefficient $\Omega(i)$ in the memory bank MB2 as such is the case with a DMT line code of the RS decoder 200, and the variable i is incremented by one. Thereafter, the OSM 226 proceeds to a connector L.

In the third case where the OSM 226 proceeds to an OS4 state 623 in which the control input C7 is set equal to "1" and a "1" is loaded into the first register R1. Thereafter, the OSM 226 moves to an OS5 state 625 in which the control input C7 is set equal to "2" and the second register R2 is loaded with S(0) from memory bank MB0. Then, the OSM 226 proceeds to an OS6 state 627 in which control inputs C3 and C4 are set equal to "0", control input C2 is set equal to "1" and the fourth register R4 is loaded with R1*R2+0, that is actually equal to S(0) since R1 is equal to "1". Thereafter, the OSM 226 continues to an OS7 state 629 in which the control input C6 is set equal to "3" and the value S(0) held in the fourth register R4 is stored as the omega polynomial coefficient $\Omega(i)$ in the memory bank MB2 as such is the case during an implementation of a DMT line code of the RS decoder 200. Thereafter, the OSM 226 proceeds to a connector L.

Figure 10B:
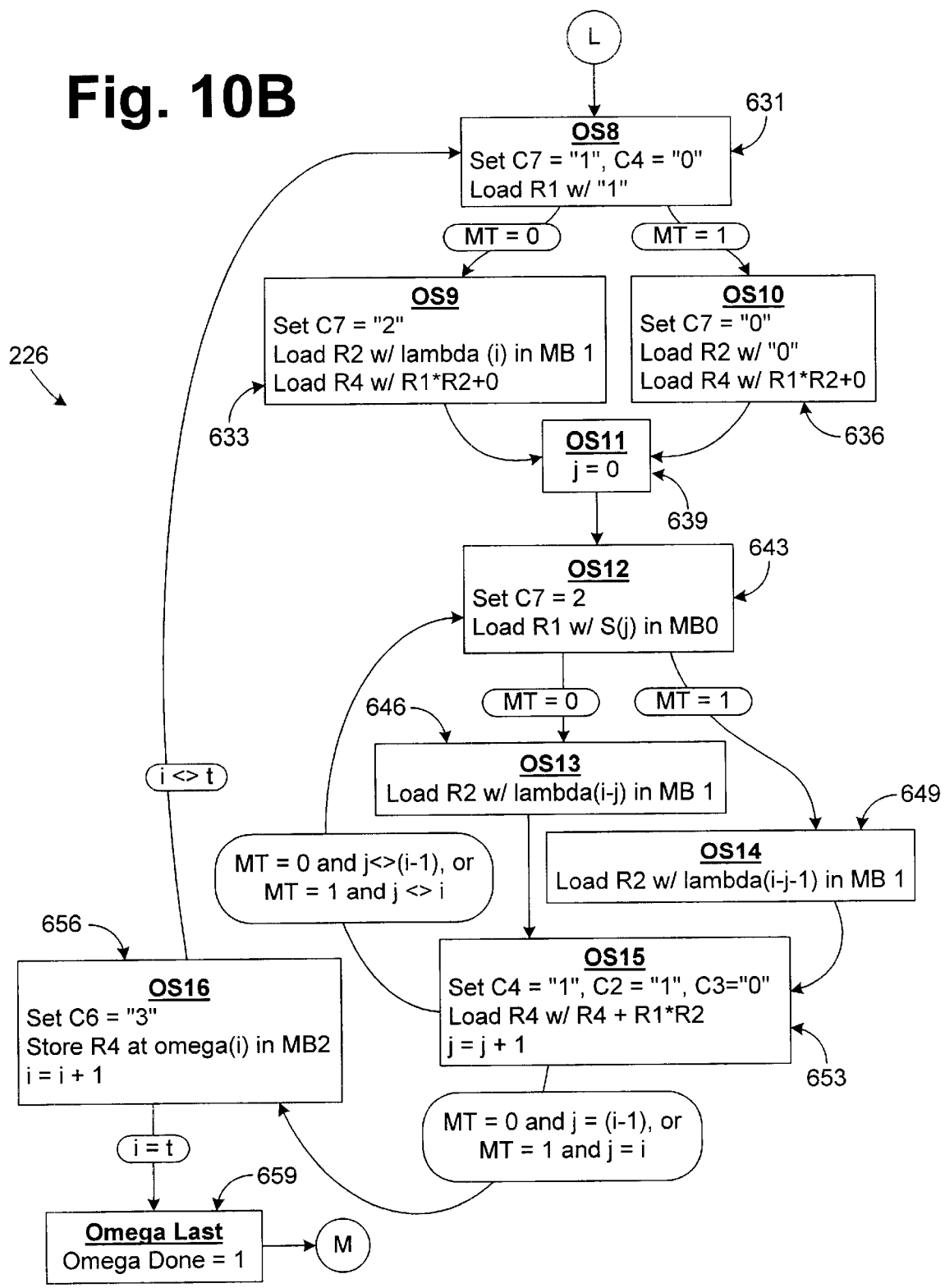

Turning then, to FIG. 10B, the OSM 226 progresses to OS8 state 631 to begin an outer loop in which the control input C4 is set equal to "0" and the control input C7 is set equal to "1". Thereafter, the first register R1 is loaded with "1". Then, if the modulation type bit is equal to a logical "0", then the OSM 226 proceeds to an OS9 state 633 in which the control input C7 is set equal to "2", the second register R2 is loaded with $\lambda(i)$ from memory bank MB1, and the fourth register R4 is loaded with R1*R2+0 that equals $\lambda(i)$ from memory bank MB1.

On the other hand, if the modulation type bit is equal to a logical "1", then the OSM 226 progresses to an OS10 state 636 in which the control input C7 is set equal to "0" and the second register R2 is loaded with "0". Also, the fourth register R4 is loaded with R1*R2+0 that equals "0". From both the OS9 state 633 and the OS10 state 636, the OSM 226 continues to an OS11 state 639 in which the variable j is set equal to zero.

Thereafter, the OSM 226 moves to an OS12 state 643 that begins an inner loop where the control input C7 is set equal to "2" and the first register R1 is loaded with S(j) from memory bank MB0. Then, if the modulation type bit is equal to a logical "0", the OSM 226 progresses to an OS13 state 646 in which the second register R2 is loaded with $\lambda(i-j)$ from memory bank MB1. On the other hand, if in the OS12 state 643 the modulation type bit is set to a logical "1", then the OSM 226 proceeds to an OS14 state 649 in which the second register R2 is loaded with $\lambda(i-j-1)$ from memory bank MB1. The OSM 226 then proceeds from both the OS13 state 646 and the OS14 state 649 to an OS15 state 653 in which the control input C4 is set equal to "1", C2 is set equal to "1", and C3 is set equal to "0", and the fourth register R4 is loaded with R4+R1*R2. Next the variable j is incremented by one.

The OSM 226 then reverts back to the OS12 state to repeat the inner loop in the OSM 226 under two conditions. The first condition is if the modulation type bit equals "0" and the variable j<>(i–1) for a CAP/QAM line code, and the second condition is if the modulation type bit equals "1" and the variable j<>i for a DMT line code. The OSM 226 will otherwise progress from the OS15 state 653 to an OS16 state 656 if the modulation type bit equals "0" and the variable j equals (i–1), or the modulation type bit equals "1" and the variable j equals i.

In the OS16 state 656, the control input C6 is set equal to "3" and the value in the fourth register R4 is stored at $\Omega(i)$ in memory bank MB2 and the variable i is incremented by one. Thereafter, if the variable i<>t, then the OSM 226 reverts back to the OS8 state 631 to repeat the outer loop of the OSM 226. If the variable i equals t, then the OSM 226 leaves the outer loop and progresses to the Omega last state 659, where the Omega done bit is set equal to a logical "1". Thereafter, the OSM 226 proceeds to connector M that reverts back to the Omega idle state 603 (FIG. 10A).

Thus the OS8 state 631 through the OS14 state 656 described above perform a multiply accumulation function in which each of the Omega polynomial coefficients $\Omega(i)$ are generated with each outer loop by executing a multiply accumulation function with the inner loop as described above.

Turning back to FIG. 7, assuming that the Omega done bit is set to a logical "1" while in the Omega state 409, the global state machine 216 progresses to the Chien state 413, thereby enabling the operation of the Chien state machine 229 by setting the Chien start bit to a logical "1".

Figure 11:
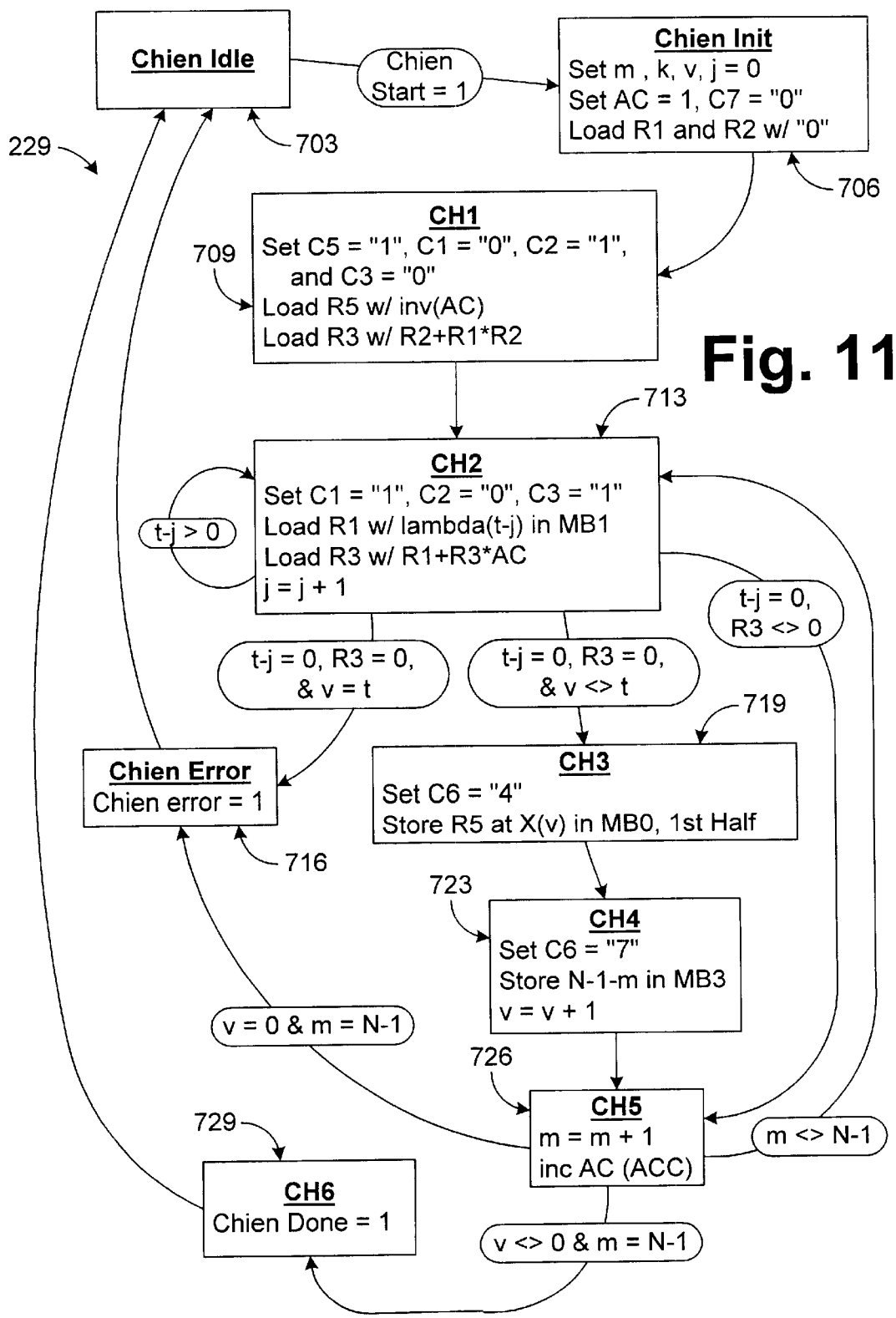
FIG. 11 is a state diagram of a Chien state machine employed in the Reed-Solomon controller in the Reed-Solomon decoder of FIG. 4.

With reference to FIG. 11, shown is the Chien state machine 229 that begins in the Chien Idle state 703. The Chien state machine 229 generally controls the Galois field computation unit 206 (FIG. 6) in a manner to execute the functionality of the Chien search algorithm 169 (FIG. 3). In this respect, the Chien state machine 229 receives the error locator array 163 (FIG. 3) and generates and error location array 173 (FIG. 3).

First, a general discussion of the Chien search algorithm is offered. Recall that the error locator array 163 comprises the coefficients of the lambda polynomial $\lambda(x)$. Each value in the error location array 173 is generated by plugging in an appropriate value of $\alpha^m$ from the alpha counter AC (FIG. 6) into the lambda polynomial $\lambda(x)$, where m ranges from 0 to n−1, where n is equal to the number symbols in the n symbol codeword 126 (FIG. 2). If $\lambda(\alpha^m)=0$, then the corresponding symbol in the position N-1-m in the n symbol codeword 126 (FIG. 2) is an error symbol.

To perform the above tasks, the Chien state machine 229 begins in the Chien Idle state 703 and progresses to the Chien initialization state 706 when the Chien start bit is set equal to a logical "1". In the Chien initialization state 706, a number of variables m, k, v, and j are set equal to zero. In addition, the alpha counter AC is set equal to one and the control input C7 is set equal to "0". Thereafter, the first and second registers R1 and R2 are loaded with a value of zero.

The Chien state machine 229 then moves on to a CH1 state 709 in which the control inputs C1 and C3 are set equal to "0", and C2 and C5 are set equal to "1". Thereafter, the fifth register R5 is loaded with the inverse of the value stored in the alpha counter AC and the third register is loaded with R2+R1*R2 that equals the value "0". Thereafter, the Chien state machine 229 progresses to a CH2 state 713 in which the control input C2 is set equal to "0" and the control inputs C1 and C3 are set equal to "1" to facilitate a recursive multiplication function. While in the CH2 state 713, a loop is executed to perform the multiply accumulation to solve the lambda polynomial $\lambda(x)$ for the appropriate value of $a^m$ held in the alpha counter AC. For each iteration of the loop that is controlled by the loop variable j, the first register R1 is loaded with an appropriate lambda coefficient $\lambda(t-j)$ from memory bank MB1. Thereafter, the third register R3 is loaded with R2+R3*AC and then the loop variable j is incremented by one. The loop will continue to execute until t−j>0. Once t−j=0, then the Chien state machine 229 moves to one of three different directions.

If a first condition exists in the CH2 state that t−j=0, R3=0, and v=t, where v is a total number of errors in the n symbol codeword, then there are t+1 errors detected and the Chien state machine 229 moves to the Chien Error state 716. This is because the Chien state machine 229 has detected more errors then the capability of the current configuration. In the Chien Error state 716, a Chien error bit is set equal to a logical "1" and, thereafter, the Chien state machine 229 reverts back to the Chien Idle state 703.

If a second condition exists where t−j=0, R3=0, and v<>t, then the Chien state machine 229 progresses to a CH3 state 719. In the CH3 state 719, the control input C6 is set equal to "4" and the value held in register R5 is stored as value in the error location array 173, also denoted X(v), in a first half of memory bank MB0, where the variable v indicates the index in the error location array 173. The Chien state machine 229 then proceeds to a CH4 state 723 in which the control input C6 is set equal to "7" and the value N-1-m is stored in memory bank MB3. The value N-1-m thus indicates the position of the symbol with the error. Thereafter, the variable v is incremented by one and then the Chien state machine 229 moves to a CH5 state 726.

If a third condition exists in the CH2 state where t−j=0, R3<>0, then the Chien state machine 229 progresses directly to the CH5 state 726 in which the variable m is incremented and the alpha counter is incremented. Note that the CH5 state 726 also occurs after the CH4 state 723. In the CH5 state 726, the alpha counter AC and the variable m are incremented to allow the multiply accumulation to be performed with the new value of $\alpha^m$.

If in the CH5 state 726, the variable m<>N−1, then the Chien state machine 229 reverts back to the CH2 state 713 where the multiply accumulation is performed with a new value $\alpha^m$ from the alpha counter AC. On the other hand, if the variable m=N−1 indicating that the last value of $\alpha^m$ had been reached, and the variable v=0, then the Chien state machine 229 reverts back to the Chien Error state 716. This occurs because no error was detected by the Chien state machine 229 even though the existence of at least one error symbol was detected by the BM master 219 (FIG. 4) and the BM slave 223 (FIG. 4). If, in the CH5 state 726, the variable v<>0 and the variable m=N−1, then the Chien state machine 229 moves to a CH6 state 729 in which a Chien done bit is set equal to "1" as the final value of $\lambda(x)$ for $\alpha^m$ had been calculated. Thereafter, the Chien state machine 229 reverts back to the Chien Idle state 703.

Turning back to FIG. 7, assuming that the Chien done bit is set to a logical "1" while in the Chien state 413, the global state machine 216 progresses to the Forney state 419, thereby enabling the operation of the Forney state machine 231 (FIG. 4) by setting the Forney start bit to a logical "1".

Figure 12:
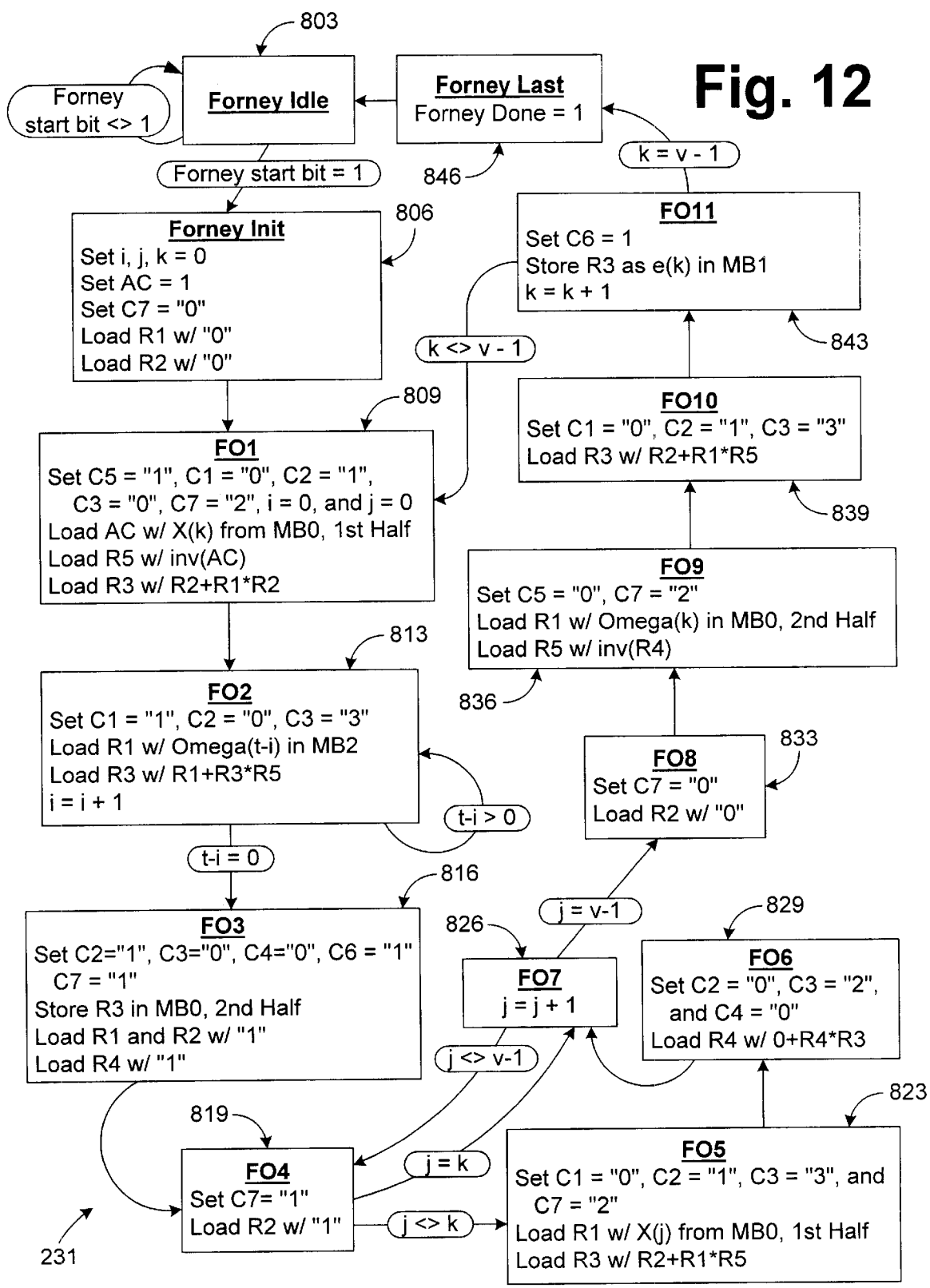
FIG. 12 is a state diagram of a Forney state machine employed in the Reed-Solomon controller in the Reed-Solomon decoder of FIG. 4.

With reference then, to FIG. 12, shown is the Forney state machine (FSM) 231 that begins in the Forney Idle state 803. The FSM 231 generally determines an error magnitude for each symbol in the n symbol codeword that experiences an error as identified by the operation of the Chien state machine 229, where there is a total of v symbols with an error that are to be corrected. Generally, the FSM 231 determines an error numerator and denominator for each of the v symbols with an error. From each corresponding numerator and denominator, an error magnitude is calculated that is subtracted from the particular symbol, thereby correcting the symbol.

With this in mind, the FSM 231 begins in the Forney Idle state 803 and, when the Forney start bit is set to a logical "1", the FSM 231 proceeds to a Forney initialization state 806. In the Forney initialization state 806, variables i, j, and k are set equal to zero, and the alpha counter is loaded with a "1". The control input C7 is set to "0" and the first and second registers R1 and R2 are both loaded with a value of zero. The FSM 231 then progresses to an FO1 state 809.

In the FO1 state 809 the FSM 231 begins to calculate the $k^{th}$ numerator. The control inputs C1 and C3 are set equal to "0", C2 and C5 are set equal to "1", and C7 is set equal to "2". Also, the variables i and j are set equal to "0". Thereafter, the alpha counter AC is loaded with X(k) from memory bank MB0, first half. The fifth register R5 is then loaded with the inverse of the X(k) from the alpha counter AC. Finally, the third register R3 is loaded with R2+R1*R2 which is equal to a value of zero.

Then, the FSM 231 progresses to an FO2 state 813 in which a loop is executed to perform a multiply accumulation function in which the inverse of X(k) is plugged into the omega polynomial Ω(x) to calculate an appropriate numerator value. In the FO2 state 813, the control input C1 is set equal to "1", C2 is set equal to "0", and C3 is set equal to "3". Thereafter, the first register R1 is loaded with an Omega polynomial coefficient Ω(t–i) from memory bank MB2 and the third register R3 is loaded with R1+R3*R5. The loop variable i is then incremented by one. At this point, if t–j>0 is true, then another iteration of the loop is performed. However, if t–j=0 then the value stored in the third register R3 is now equal to the appropriate numerator and the FSM 231 progresses to an FO3 state 816.

In the FO3 state 816, first the control inputs C2, C6, and C7 are set equal to "1", and the control inputs C3 and C4 are set equal to "0". Thereafter, the value held by the third register R3 is stored in the memory bank MB0, $2^{nd}$ half. In this manner, the numerator is stored in the memory bank MB0, $2^{nd}$ half. Also, the first, second and fourth registers R1, R2 and R4 are loaded with a value of one.

The FSM 231 then progresses to an FO4 state 819 to begin to calculate the appropriate denominator values which is generally determined by the mathematical equation $$\prod_{j=1, j\neq 1}^{v} \left(1 + \frac{Xj}{Xi}\right).$$

This is calculated using a product function as follows. In the FO4 state 819, the control input C7 is set equal to "1" and a value of one is loaded into the second register R2. Then, if j<>k, the FSM 231 moves to an FO5 state 823. On the other hand, if j=k, then the FSM 231 moves to an FO7 state 826.

In the FO5 state 823, the control inputs are set as follows: C1="0", C2="1", C3="3" and C7="2". Thereafter, the first register R1 is loaded with X(j) from memory bank MB0, $1^{st}$ half, and the third register R3 is loaded with R2+R1*R5. The FSM 231 then progresses to an FO6 state 829 in which control inputs C2 and C4 are set equal to "0" and C3 is set equal to "2". Thereafter, the fourth register R4 is loaded with 0+R4*R3 and then the FSM 231 progresses to the FO7 state 826.

In the FO7 state 826, the loop variable j is incremented by one. Then, if j<>v–1, the FSM 231 will revert back to the FO4 state 819 to perform another iteration of the loop where the fourth register R4 maintains the value of the product function. On the other hand, if j=v–1 in the FO7 state 826, then the FSM 231 progresses to an FO8 state 833 where the final calculation of a current error magnitude e(k) begins. In particular, in the FO8 state 833, the control input C7 is set equal to "0" and the second register is loaded with a value of zero. Thereafter, the FSM 231 moves to and FO9 state 836 in which the control input C5 is set equal to "0" and control input C7 is set equal to "2". The first register R1 is then loaded with the numerator value Ω(k) that was previously stored in memory bank MB0, $2^{nd}$ half in the FO3 state 816. Also, the fifth register R5 is loaded with the inverse of the value held by the fourth register R4 which is the denominator value. The FSM 231 progresses to the FO10 state 839 in which control input C1 is set equal to "0", C2 is set equal to "1", and C3 is set equal to "3". The third register R3 is loaded with R2+R1*R5 which is equal to the nominator divided by the denominator, resulting in the error magnitude e(k).

Next, in an FO11 state 843, the control input C6 is set equal to "1" and the error magnitude e(k) held in the third register R3 is stored in memory bank MB1. Thereafter, the loop variable k is incremented by one to calculate the next error magnitude e(k). At this point, if k<v–1, then the FSM 231 reverts back to the FO1 state 809 to perform another iteration of the loop to generate the next error magnitude e(k). On the other hand, if k=v–1, then the last error magnitude e(k) has been calculated and the FSM 231 progresses to the Forney Last state 846 where the Forney done bit is set equal to "1".

Referring back to FIG. 7, once the Forney done bit is set equal to a logical "1", then the global state machine 216 progresses to the Success state 423 in which the success bit is set equal to "1", thereby enabling the performance of the correct data routine 183 (FIG. 3).

With reference to FIG. 6, the data buffer/correction circuit 333 performs the tasks of the correct data routine 183 (FIG. 3). In particular, the success bit enables state machinery that transfers the error magnitudes e(k) stored in memory bank MB1 to the data buffer/correction circuit 333 that subtracts those values from the appropriate symbols with an error in the n symbol codeword 126 (FIG. 3), thereby generating the corrected n symbol codeword 186 (FIG. 3).

Many variations and modifications may be made to the above-described embodiment(s) of the invention without departing substantially from the spirit and principles of the invention. All such modifications and variations are intended to be included herein within the scope of the present invention.

Therefore, having thus described the invention, at least the following is claimed:

1. A configurable Galois field computation unit, comprising:
   a read bus;
   a write bus;
   a memory coupled between the read and write busses;
   a logical circuit coupled between the read and write busses, the logical circuit having a number of data calculation configurations, one of said data calculation configurations being established to generate an n symbol codeword from a number of symbols in a syndrome array.

2. The computation unit of claim 1, wherein the logical circuit further comprises a number of control multiplexers, wherein the control multiplexers establish the data calculation configurations based upon a number of control inputs.

3. The computation unit of claim 1, wherein the data calculation configurations further comprise a multiply accumulation configuration.

4. The computation unit of claim 1, wherein the data calculation configurations further comprise a recursive multiplication configuration.

5. The computation unit of claim 1, wherein the data calculation configurations further comprise a product operation configuration.

6. The computation unit of claim 1, wherein the data calculation configurations further comprise a division configuration.

7. The computation unit of claim 1, wherein the data calculation configurations further comprise a memory shifting configuration.

8. The computation unit of claim 1, further comprising an address generation unit to identify a number of memory locations in the memory to which data is written via the write bus and from which data is read via the read bus.

9. The computation unit of claim 1, wherein the logical circuit further comprises a data correction unit coupled to the read bus to correct at least one error symbol in the n symbol codeword with at least one error magnitude, the error magnitude being calculated by the logical circuit.

10. A configurable Galois field computation unit, comprising:

a read bus;

a write bus;

storage means for storing a number of data values, the storage means being coupled between the read and write busses;

logical means for performing a number of data calculations by establishing one of a number of data calculation configurations to generate an n symbol codeword from a number of symbols in a syndrome array, the logical means being coupled between the read and write busses.

11. The computation unit of claim 10, wherein the logical means further comprises means for establishing at least one of a number of data calculations via a number of control inputs.

12. The computation unit of claim 10, wherein the logical means further comprises means for performing a multiply accumulation operation.

13. The computation unit of claim 10, wherein the logical means further comprises means for performing a recursive multiplication operation.

14. The computation unit of claim 10, wherein the logical means further comprises means for performing a product operation.

15. The computation unit of claim 10, wherein the logical means further comprises means for performing a division operation.

16. The computation unit of claim 10, wherein the logical means further comprises means for performing a memory shifting operation.

17. The computation unit of claim 10, further comprising means for identifying a number of memory locations in the memory to which data is written via the write bus and from which data is read via the read bus.

18. The computation unit of claim 10, wherein the logical means further comprises means for correcting at least one error symbol in the n symbol codeword with at least one error magnitude, the error magnitude being calculated by the logical means.

19. A method for performing a number of calculations in a Galois field computation unit to generate an n symbol codeword from a number of symbols in a syndrome array, comprising the steps of:

storing a number of data symbols in a memory;

establishing, in a logical circuit having a number of data paths, at least one data calculation configuration from a number of data calculation configurations to generate an n symbol codeword from a number of symbols in a syndrome array, the logical circuit being coupled to the memory;

applying the data symbols to the data paths to perform a data calculation based upon the data calculation configuration established; and storing a result of the data calculation in the memory.

20. The method of claim 19, wherein the step of establishing at least one data calculation configuration further comprises the step of setting a number of control inputs on a number of multiplexers in the logical circuit.

21. The method of claim 19, wherein the step of establishing at least one data calculation configuration further comprises the step of establishing a multiply accumulation configuration to perform a multiply accumulation operation.

22. The method of claim 19, wherein the step of establishing at least one data calculation configuration further comprises the step of establishing a recursive multiplication configuration to perform a recursive multiplication operation.

23. The method of claim 19, wherein the step of establishing at least one data calculation configuration further comprises the step of establishing a product configuration to perform a product operation.

24. The method of claim 19, wherein the step of establishing at least one data calculation configuration further comprises the step of establishing a division configuration to perform a division operation.

25. The method of claim 19, wherein the step of establishing at least one data calculation configuration further comprises the step of establishing a memory shifting configuration to perform a memory shift operation.

26. The method of claim 19, further comprising the step of identifying a number of memory locations in the memory to which data is written and from which data is read.

27. The method of claim 19, further comprising the step of correcting at least one error symbol in the n symbol codeword with at least one error magnitude, the error magnitude being calculated by the logical means.

* * * * *